United States Patent
Wegener

(10) Patent No.: US 9,118,345 B2
(45) Date of Patent: Aug. 25, 2015

(54) DATA COMPRESSION PROFILER FOR CONFIGURATION OF COMPRESSION

(71) Applicant: Altera Corporation, San Jose, CA (US)

(72) Inventor: Albert W. Wegener, Aptos Hills, CA (US)

(73) Assignee: Altera Corporation, San Jose, CA (US)

( * ) Notice: Subject to any disclaimer, the term of this patent is extended or adjusted under 35 U.S.C. 154(b) by 482 days.

(21) Appl. No.: 13/645,373

(22) Filed: Oct. 4, 2012

(65) Prior Publication Data

US 2014/0101485 A1    Apr. 10, 2014

(51) Int. Cl.
*G06F 7/00* (2006.01)
*H03M 7/30* (2006.01)

(52) U.S. Cl.
CPC ............. *H03M 7/607* (2013.01); *H03M 7/3068* (2013.01); *H03M 7/3079* (2013.01)

(58) Field of Classification Search
CPC .......................... G06F 17/30153; H04L 69/04
USPC .............................. 714/32; 707/693; 708/203
See application file for complete search history.

(56) References Cited

U.S. PATENT DOCUMENTS

| | | | |
|---|---|---|---|
| 5,839,100 A | 11/1998 | Wegener | |
| 7,009,533 B1 | 3/2006 | Wegener | |
| 8,204,106 B2 | 6/2012 | Sadowski et al. | |
| 8,301,803 B2 | 10/2012 | Wegener | |
| 2005/0219076 A1* | 10/2005 | Harris | 341/51 |
| 2009/0073006 A1* | 3/2009 | Wegener | 341/61 |
| 2010/0121972 A1* | 5/2010 | Samuels et al. | 709/231 |
| 2011/0078222 A1 | 3/2011 | Wegener | |
| 2011/0158307 A1* | 6/2011 | Lee et al. | 375/240 |
| 2013/0007076 A1 | 1/2013 | Wegener | |
| 2013/0036101 A1* | 2/2013 | Marwah et al. | 707/693 |

FOREIGN PATENT DOCUMENTS

CN    101645885 A    10/2010
(Continued)

OTHER PUBLICATIONS

Wegener, Albert, U.S. Appl. No. 13/616,898 entitled "Processing System and Method Including Data Compression API," filed on Sep. 14, 2012, 83 pages.
Wegener, Albert, U.S. Appl. No. 13/617,061 entitled "Conversion and Compression of Floating Point and Integer Data," filed on Sep. 14, 2012, 78 pages.
(Continued)

*Primary Examiner* — Chae Ko
(74) *Attorney, Agent, or Firm* — Okamoto & Benedicto LLP

(57) ABSTRACT

A method and apparatus for determining one or more compression parameters suitable to compress a class of signals, may include inputting a test data set, being representative of a data set to be compressed, characterizing the test data, selecting a compression algorithm, calculating a distortion level to be used in determining the compression ratio (or a compression ratio to be used in determining the distortion level), generating a computer implemented model for the test data, selecting a recommended operating point based on a computer implemented model, and determining compression parameters corresponding to the operating point. The compression parameters may subsequently be applied for configuration of compression applied to one or more production data sets that are similar to the test data. This abstract does not limit the scope of the invention as described in the claims.

69 Claims, 15 Drawing Sheets

(56) References Cited

FOREIGN PATENT DOCUMENTS

| | | | |
|---|---|---|---|
| JP | 2004361310 A | 12/2004 | |
| JP | 2006186480 A | 7/2006 | |
| WO | WO 95/24792 A1 | 9/1995 | |
| WO | WO 97/43860 A1 | 11/1997 | |
| WO | WO 9743860 A1 * | 11/1997 | ............... H04N 7/30 |

OTHER PUBLICATIONS

Wegener, Albert, U.S. Appl. No. 13/617,205 entitled "Data Compression for Direct Memory Access Transfers," filed on Sep. 14, 2012, 70 pages.

PCT International Search Report and Written Opinion of the International Searching Authority for Application No. PCT/US2013/062858, Jan. 23, 2014, 6 sheets.

* cited by examiner

| Time or Frequency Domain | Absolute or Relative | Static or Dynamic | Distortion |
|---|---|---|---|
| Time Domain | Absolute | Static | x and y |
| | | | x and e |
| | | Dynamic | x and y over time |
| | | | x and e over time |
| | Relative | Static | x and y |
| | | | x and e |
| | | Dynamic | x and y over time |
| | | | x and e over time |
| Frequency Domain | Absolute | Static | psd(x) and psd(y) |
| | | | psd(x) and psd(e) |
| | | Dynamic | psd(x) and psd(y) over time |
| | | | psd(x) and psd(e) over time |
| | Relative | Static | psd(x) and psd(y) |
| | | | psd(x) and psd(e) |
| | | Dynamic | psd(x) and psd(y) over time |
| | | | psd(x) and psd(e) over time |

Figure 3

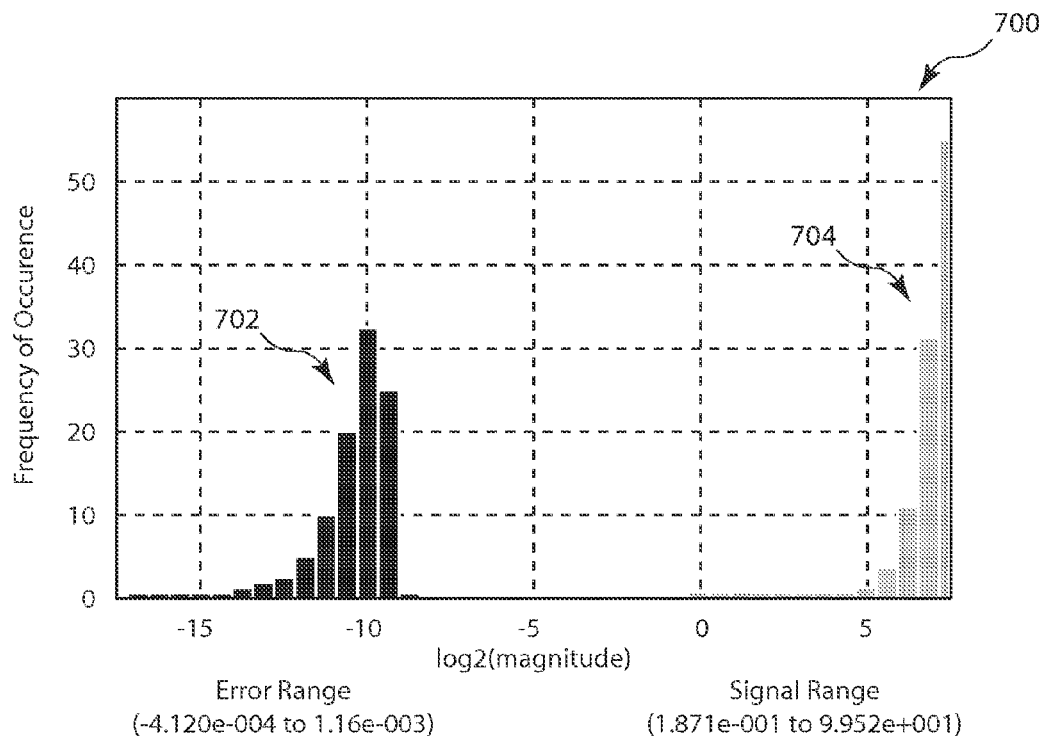
Error Range
(-4.120e-004 to 1.16e-003)
Signal Range
(1.871e-001 to 9.952e+001)
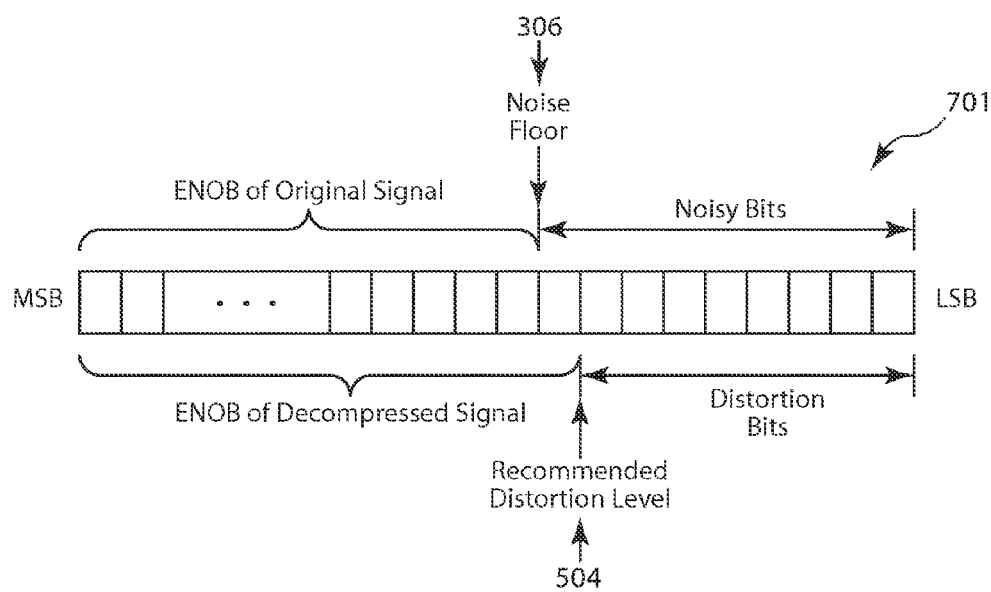
Figure 8

| Field Name | Bits | Notes |
|---|---|---|
| SOURCE | [63 or 31:0] | Start address of the source (uncompressed) buffer. Transactions advance the initial SOURCE address by N_PKTS*PKT_LENGTH |
| DEST | [63 or 31:0] | Start address of destination (compressed) buffer. Transactions advance initial DEST pointer by the number of 32-bit words written to the compressed array: C_LENGTH(comp) = 1 + DEST (end) - DEST (start) |
| N_PKTS | [15:0] | Number of packets to compress or copy, 1 to 65535 (unsigned 16-bit int) |
| PKT_LENGTH | [15:0] | Number of samples per packet (unsigned int from 32 to 65536) -1 (typically a multiple of 6 or a power of 2) |
| D_TYPE | [15:13] | DATATYPE: 0:uint, 1:int, 2:float, 3:RGB, 4:YUV, 5:Bayer 6 - 8:reserved |
|  | [12:10] | BITS_PER_SAMP: 0: 8, 1: 10, 2: 12, 3: 14, 4: 16, 5: 32, 6: 64, 7: reserved |
|  | [9:6] | Color Image Format  Format 0 - 8:   Format 9 - 15:reserved |
|  | [5:4] | YUV Color Space Decimation 0:none, 1: 4:4:4 → 4:2:2, 2: 4:4:4 → 4:2:0 |
|  | [3:2] | Color Space Conversion: 0 = OFF, 1 = RGB → YUV, 2 = RGB → YCrCb (studio), 3 = RGB → YCrCb (computer) |
|  | [1:0] | Bits [1:0] are reserved |
| VERSION | [15:0] | Version number |
| RR_CONFIG | [15:13] | RR_STRIDE2: 1, 2, 3, 4, 6 |
|  | [12:10] | RR_MANUAL_STRIDE: 1, 2, 3, 4, 6 |
|  | [9] | RR_MANUAL_ADD_SUB: 0 = subtract, 1 = add |
|  | [8,7] | RR_MANUAL_DERIV: 0, 1, 2 (samps, dif1, dif2) |
|  | [6:3] | Bits [6:3] are reserved |
|  | [2:0] | RR_AUTO_MANUAL (0 = AUTO, 1 = MANUAL) Bit 2: STRIDE1   Bit 1: ADD_SUB   Bit3: DERIV |
| MODE | [15:12] | C_MODE: 0:copy only  1:lossless   2:average rate 3:constant rate   4:fixed quality (increments of 0.5 db) Floating-Point modes only: 5:FP2 fixed rate, 6:FP2 ABS error, 7:FP2 REL error 8:FP4 fixed rate, 9:FP4 ABS error, 10:FP4 REL error Bits [11:14] |
|  | [11:0] | C_PARAM (10, 11, or 12 bits): Avg & Const Rate:        #dwords per packet*in[11:0] Fixed Quality (dB):       ATTEN (6.4 format; [9:0]) FP2 & FP4 ABS error:    EXP_THRESH (floats; [10:0]) FP2 & FP4 REL error:    % error (0.1% to 99.9%; [9:0]) |
| H_DIM | [15:0] | Number of samples or color components per 2D row |
| V_DIM | [15:0] | Number of rasters per 2D frame or rows per 2D matrix |

Figure 9

DATA COMPRESSION PROFILER FOR CONFIGURATION OF COMPRESSION

BACKGROUND

The present invention is directed to a data compression profiler for configuration of compression to be applied to a particular type of data set to achieve a desired compression ratio or distortion level.

Compression algorithms in common applications, such as audio and video compression, use compression parameters based on a priori knowledge of the data characteristics to produce compressed data having specified compression ratios. Examples include the widely used JPEG and MPEG for image/video compression and MP3 and WAV for audio compression. In particular, MPEG profiles set parameters for the video compressor that will provide desired output bit rates or compression ratios of the compressed video data.

In other applications, users may not have a full understanding of how to select appropriate parameters for a compression processor that will result in compressed data having an acceptable distortion level or compression ratio for the particular signal characteristics. Applications, referred to herein as high performance computing (HPC) applications, including supercomputing, high energy physics, climate modeling, weather forecasting, finite element analysis, thermal and fluid flow, and oil exploration data, generate immense data sets for a wide variety of signal types. As of 2012, datasets for such simulations typically contain hundreds of Gigabytes (10E9 Bytes) and for some applications may contain Petabytes (10E15) of data. Such large datasets cause immense bandwidth and capacity bottlenecks in computing systems, so compression of such datasets has significant economic value. Optimal configuration of the compression processing based on the signal characteristics can provide more efficient use of computing resources and data storage capacity. Therefore, there is a need for a systematic process for determining appropriate compression parameters for a given signal or data set for use with or selection of a compression algorithm.

Commonly owned patents and applications describe a variety of compression techniques applicable to fixed-point (integer) and floating-point representations of numerical data, signal samples or image samples. These include U.S. Pat. No. 5,839,100 (the '100 patent), entitled "Lossless and loss-limited Compression of Sampled Data Signals," by Wegener, issued Nov. 17, 1998. The commonly owned U.S. Pat. No. 7,009,533, (the '533 patent) entitled "Adaptive Compression and Decompression of Bandlimited Signals," by Wegener, issued Mar. 7, 2006, incorporated herein by reference, describes compression algorithms that are configurable based on the signal data characteristic and measurement of pertinent signal characteristics for compression. The commonly owned U.S. patent application Ser. No. 12/605,245 (the '245 application), entitled "Block Floating Point Compression of Signal Data," by Wegener, publication number 2011-0099295, published Apr. 28, 2011, incorporated herein by reference, describes a block-floating point encoder and decoder for integer samples. The commonly owned U.S. patent application Ser. No. 13/534,330 (the '330 application), filed Jun. 27, 2012, entitled "Computationally Efficient Compression of Floating-Point Data," by Wegener, incorporated herein by reference, describes algorithms for direct compression floating-point data by processing the exponent values and the mantissa values of the floating-point format. The commonly owned patent application Ser. No. 13/617,061 (the '061 application), filed Sep. 14, 2012, entitled "Conversion and Compression of Floating Point and Integer Data," by Wegener, incorporated herein by reference, describes algorithms for converting floating-point data to integer data and compression of the integer data. The profiler described in the present specification may determine parameters for these compression algorithms for application to particular data sets.

The commonly owned patent application Ser. No. 12/891,312 (the '312 application), entitled "Enhanced Multi-processor Waveform Data Exchange Using Compression and Decompression," by Wegener, publication number 2011-0078222, published Mar. 31, 2011, incorporated herein by reference, describes configurable compression and decompression for fixed-point or floating-point data types in computing systems having multi-core processors. In a multi-core processing environment, input, intermediate, and output waveform data are often exchanged among cores and between cores and memory devices. The '312 application describes a configurable compressor/decompressor at each core that can compress/decompress integer or floating-point waveform data. The '312 application describes configurable compression/decompression at the memory controller to compress/decompress integer or floating-point waveform data for transfer to/from off-chip memory in compressed packets. The profiler described in the present specification may determine parameters or select compression algorithms for the configurable compressor and decompressor of the '312 application.

The commonly owned patent application Ser. No. 13/617,205 (the '205 application), filed Sep. 14, 2012, entitled "Data Compression for Direct Memory Access Transfers," by Wegener, incorporated herein by reference, describes providing compression for direct memory access (DMA) transfers of data and parameters for compression via a DMA descriptor. Parameters for compression provided to the DMA descriptor may be determined by profiler described herein. The commonly owned patent application Ser. No. 13/616,898 (the '898 application), filed Sep. 14, 2012, entitled "Processing System and Method Including Data Compression API," by Wegener, incorporated herein by reference, describes an application programming interface (API), including operations and parameters for the operations, which provides for data compression and decompression in conjunction with processes for moving data between memory elements of a memory system. The profiler described herein may provide parameters for the compression operations of the API.

SUMMARY

The application of compression to a particular type of data is enhanced by a data compression profiler to provide one or more parameters for the compression algorithm. The compression profiler may be implemented in a computer system having a data processor and memory accessible by the data processor. The data processor may execute functions that implement operations of the profiler. The profiler operations apply the compression algorithm to a test data set to generate a plurality of compressed test data sets using a range of compression parameters, so that the compressed data sets will have a plurality of compression ratios and a plurality of distortion levels. The test data set is representative of the data set to be compressed. The profiler operations generate data characterizing correlation between changes in the parameters of the compression algorithm and distortion. The data can be used to form a model the correlations between parameter changes and loss of data by the compression procedure. In cases in which the compression parameter corresponds with compression rate and the loss of data corresponds with distortion, the model can comprise a rate-distortion curve for the data set. Using the model and an input value reflecting minimum loss, or maximum distortion, or another desired characteristic, the parameters for the compression procedure can be automatically determined. For example, an input can identify an operating point on a rate-distortion curve, wherein the operating point is associated with a selected compression ratio and a selected distortion level. The profiler determines one or more parameters for the compression algorithm based on the operating point. The parameters determined using the model may be stored in the memory for use to configure the compression algorithm to be applied the data set. The compression may be applied to the data set by compression logic in the data processor, by external compression logic or by a different computer system. The parameters for the compression algorithm may be provided to the compression logic by a DMA descriptor or an API.

One of the characteristics of the test data set that may be measured by the profiler, or otherwise included in the model, is the noise floor. The profiler may select the operating point based on the noise floor. By setting the selected distortion level to a value below the noise floor, the compression distortion will be in the "noisy bits" of the original samples of the test data set. Preferably the selected distortion level is at least 6 decibels (dB) below the noise floor.

To aid in the selection of a compression algorithm, a plurality of compression algorithms may be applied to the test data set to generate models for each of the compression algorithms. The user may provide criteria for the selection of a compression algorithm based on performance parameters, and the processor can utilize the models for the plurality of compression algorithms to select a best fit for the provided criteria.

The test data set may be a subset of the data set to be compressed. The profiler may be configured to provide dynamic profiling. Dynamic profiling provides updates to the parameters by measuring characteristics of different subsets of the data set selected at various intervals, and producing updated parameters for the compression algorithm based on the previous model or updated models. Updated models can be used with the selected operating points to adjust parameters of the compression algorithm.

As mentioned above, one model that can be used is a rate-distortion curve. The rate-distortion curve relates compression ratios and compression distortion levels. Several metrics may be used for the compression ratio. The typical metric for the compression ratio is the ratio of the number of bits in the original samples to the number of bits in the compressed samples. Other metrics of the compression ratio include the number of bits per compressed sample, the percentage size reduction of the compressed test data set compared to the test data set and the percentage of an original size of the test data set. The distortion level may be calculated based on the error between the decompressed samples and the original samples. Other metrics for the distortion level include a percent uncertainty, an effective number of bits (ENOB) and a number of significant digits.

BRIEF DESCRIPTION OF DRAWINGS

FIG. 3 lists many methods for determining distortion as a function of the input signal x, decompressed signal y and error signal e.

FIG. 8 illustrates the relationships between the effective bits of an uncompressed and compressed signals, noise floor and distortion.

FIG. 9 illustrates an example of the parameters stored in a DMA descriptor for storage of parameters for the compressor.

DETAILED DESCRIPTION

Figure 1:
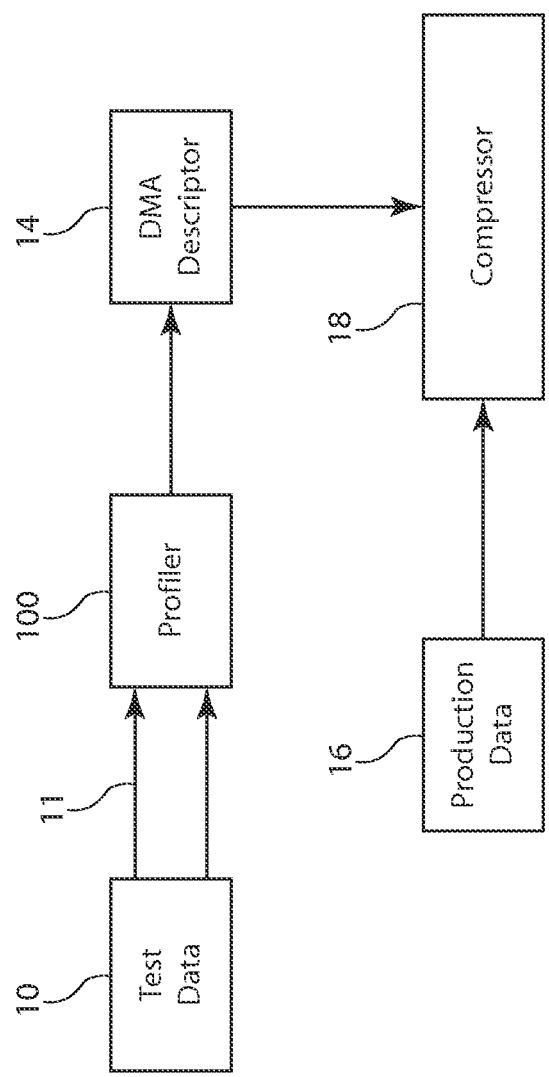
FIG. 1 illustrates where the profiler operates with respect to compression and decompression of a data set.

The data compression configuration technology described herein is referred to as a profiler. The profiler provides a structured process for determining compression parameters. FIG. 1 illustrates where the profiler 12 operates with respect to compression and decompression of a data set. Production data 16 is any data that a user may want to compress and store. The user may select a set of test data 10 from the production data 16 that is representative of the entire production data 16. Alternatively, the test data 10 may provide samples that are typical data or simulated data of the signal type in the production data 16. The selected test data 10 and the data format information 11 are entered into the profiler 12 wherein the profiler may determine a compression ratio, a decompressed signal quality setting, and other compression parameters. Data format information 11 may include a data type specifier indicating the data type of test data 10 and production data 16, selected from common numerical data types typically used in computer systems, such as (but not limited to) int8 (signed 8-bit integers), uint8 (unsigned 8-bit integers), int16 (signed 16-bit integers), uint16 (unsigned 16-bit integers), int32 (signed 32-bit integers), uint32 (unsigned 32-bit integers), single (32-bit floating-point numbers), and double (64-bit floating-point numbers). The compression ratio and other parameters may be stored in a direct memory access (DMA) descriptor 14 associated with the production data 16 which contains information for the configuration of the compressor 18. The compression ratio and parameters may also be provided to an applications program interface (API) for configuring compression logic. Alternatively, the profiler output may be stored separately in text (.txt) format or binary format in a data storage device.

Figure 2:
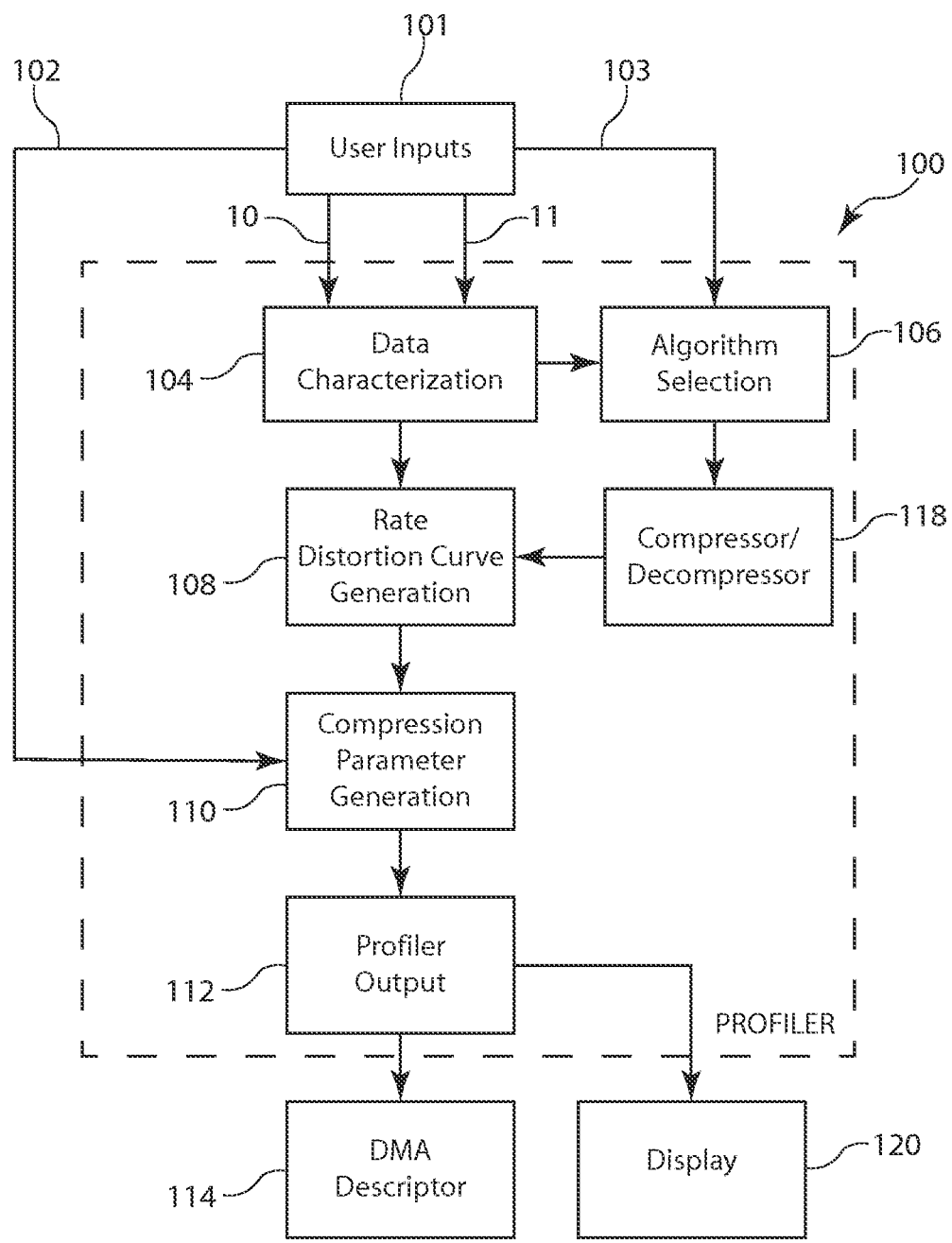
FIG. 2 is a block diagram of the data compression profiler.

FIG. 2 is a block diagram of the data compression profiler 100 processes. First, inputs 101 comprising test data 10 representative of the signal to be compressed along with signal and compression related parameters are provided to several processing blocks of the profiler 100. Inputs 101 can include, but are not limited to the following:

1) A set of test data 10 (representative of production data 16) provided to the data characterization 104 block.
2) Data format information 11 input into the data characterization 104 block may include data type identifier (examples listed above), number of bits per sample, and data dimensions, such as one-dimensional (1D) or two-dimensional (2D). 2D data may contain an image or a sequence of images. If the data format is 2D image data, then data format information 11 may include additional image format information, such as color space (RGB, YUV, YCrCb, etc.), color space decimation (4:4:4, 4:2:2, 4:2:0, etc.), and number of color planes (3 for RGB images, 4 for Bayer matrix images, etc.).
3) Types of compression input to the data characterization 104 block may include:
    a) Default—The profiler may apply default configurations of compression algorithms for lossless and lossy compression of the test data 10. For lossless compression, the profiler may report the lossless compression ratio. For lossy compression, the profiler will typically apply a plurality of compression ratios or quality settings to create a rate-distortion curve for the test data 10. Based on certain characteristics of the test data 10, the profiler also determines a recommended operating point.
    b) Compression Mode Selection—The user specifies a compression operating mode. For instance, users sometimes require a fixed compression ratio, such as 2:1 or 3.33:1, in which case users specify a fixed rate compression mode. In other instances users may require a known signal quality or maximum distortion level, such as 68 dB or 0.02%, in which case users specify a fixed quality compression mode. In yet other situations, users may specify a lossless compression mode (resulting in no distortion but some compression).
4) Once the profiler's rate-distortion curve generation 108 calculates the rate-distortion (R-D) curve and the recommended operating point on the R-D curve, users optionally may specify another operating point on the R-D curve to compression parameter generation block 110, either by selecting an alternate compression ratio (implicitly selecting fixed rate compression mode) or an alternate signal quality or distortion level (implicitly selecting fixed quality compression mode). The operation of this optional step is further described with respect to FIG. 4. In embodiments described herein, the model produced by the profiler is referred to as a rate-distortion curve, which is one model type that can be used. Other types of models can be used, such as models based on parameters other than compression ratio and distortion, and models based on correlations among more than two parameters, such three parameters like compression speed, compression ratio and distortion. The following discussion focuses on the rate-distortion curve model, but can be extended to other model types.
5) As further described with respect to FIG. 5, when two or more compression algorithms are available, users may select from among the available compression algorithms based on a complexity metric. For instance, in real-time data processing systems simple compression and/or decompression algorithms may be preferred because they operate more quickly (bytes/sec) than more complex compression and/or decompression algorithms, and thus use fewer system resources (such as memory, CPU cycles, CMOS silicon area or power). On the other hand, if system resources are not limited, more complex algorithms may result in higher compression ratios for a given level of decompressed signal quality, or in higher signal quality for a given compression ratio. Users may optionally specify an algorithm selection to the profiler in order to control the system resource utilization and achieved compression results.

Figure 4:
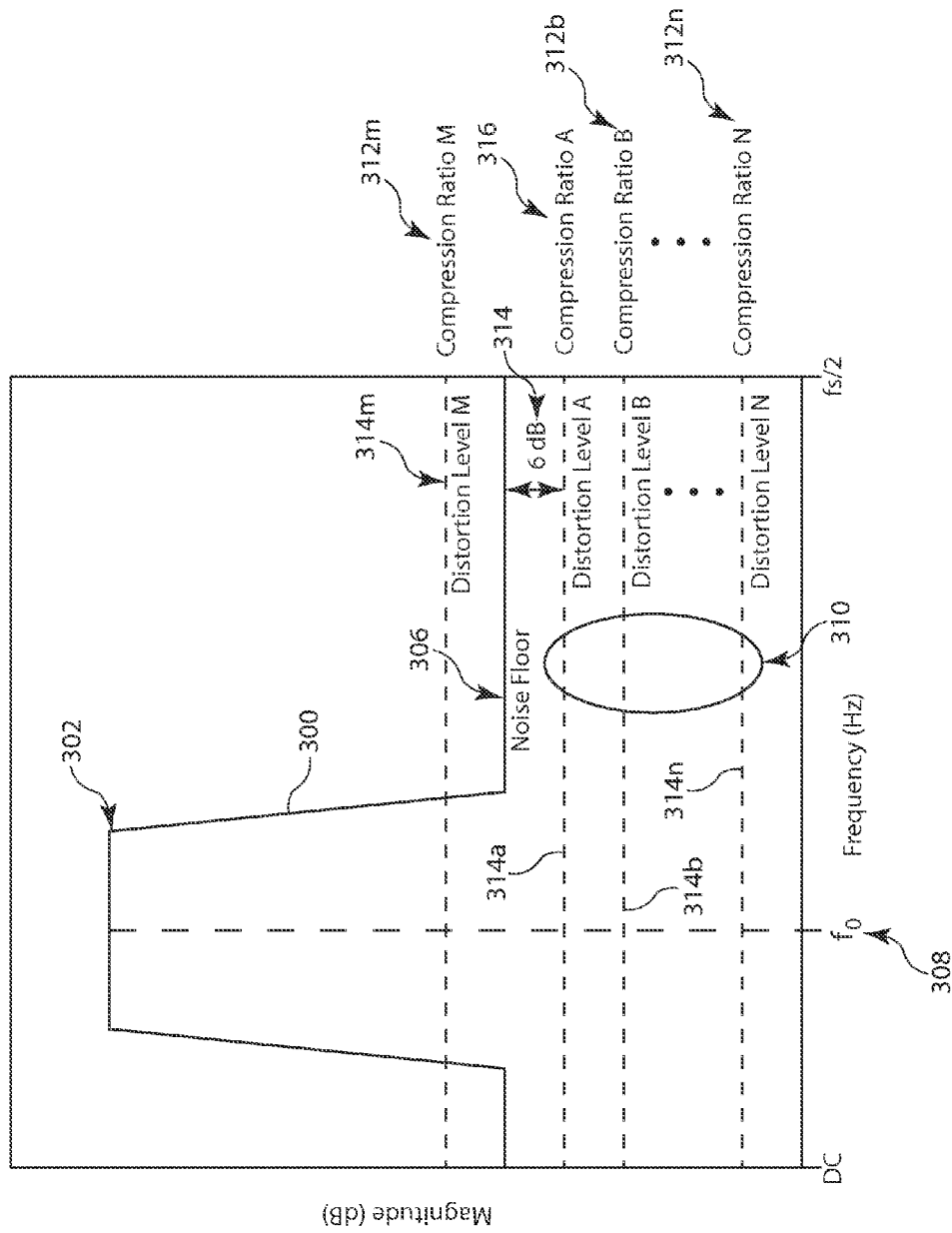
FIG. 4 shows a graph representing the spectrum of a signal, its noise floor, and multiple distortion levels and their related compression ratios.

The data characterization block 104 measures various parameters of the test data 10, such as the spectral peak, spectral noise floor, time-domain peak, time-domain mean, variance, and/or standard deviation. The profiler then uses one or more of these parameters generated by data characterization 104 to determine a distortion level or noise floor, as described with respect to FIGS. 3 and 4. Several methods for calculating the compression distortion 202 as a function of the input signal x, the decompressed signal y, and an error signal e ($e=x-y$) are listed in FIG. 3. FIG. 4 illustrates the spectrum of a portion of the test data 10 and shows the relationship between the noise floor 306 of the spectrum and various distortion levels and their associated compression ratios. When the distortion level of a decompressed signal y is below the noise floor 306 of the spectrum of test data 10, representing the original signal x, subsequent calculations performed using the decompressed signal y, in place of the original signal x should not substantially affect the results.

The algorithm selection block 106 (described with respect to FIG. 5) may include a list of compression algorithms, compression modes (lossless, fixed rate, fixed quality, etc.), or compression performance parameters, described below, such as complexity metrics for achieving a desired compression ratio or desired decompressed signal quality. The algorithm selection 106 may select a compression algorithm based on performance parameters chosen by the user. Alternatively, the user may choose a default compression algorithm, mode, and/or performance parameter, which may be the one that the profiler recommends.

The compressor/decompressor block 118 applies the selected compression algorithm to the test data 10 to produce compressed test data for the distortion measurements used to generate the rate-distortion curve. The compressor/decompressor 118 may decompress the compressed test data to form decompressed test data for distortion measurements, as described with respect to FIG. 3. Referring to FIG. 1, the profiler 12 may include logic for the compressor/decompressor block 118 applied to the test data 10. Alternatively, the profiler 12 may access the compressor 18 used to compress the production data 16 or an external compressor/decompressor.

Figure 6:
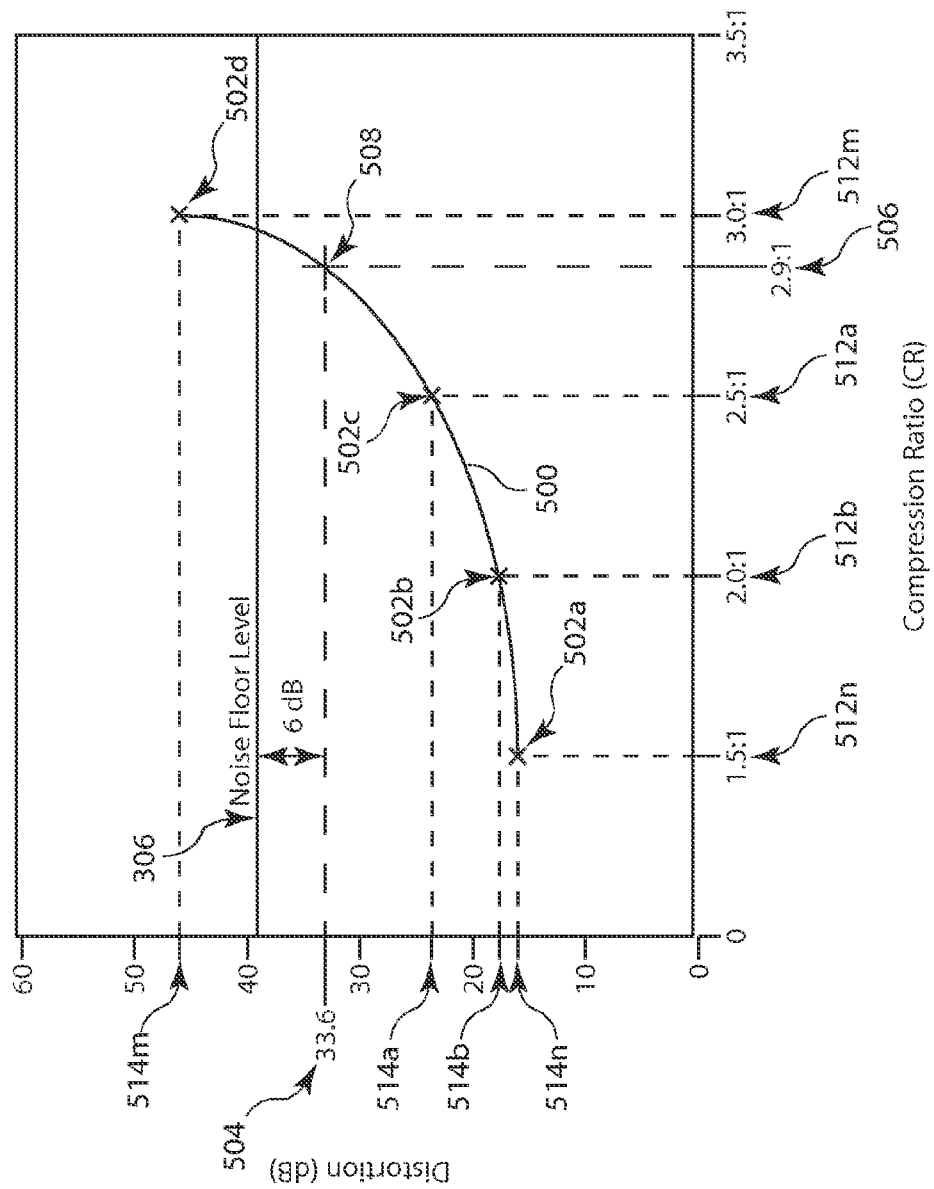
FIG. 6 illustrates an example of a rate-distortion curve in relation to the calculated noise floor and selected operating point.

The rate-distortion curve generation block 108 measures the distortion levels resulting from the selected algorithm applied to the test data 10 at different compression ratios. The rate-distortion curve relates distortion levels to compression ratios. The distortion levels and compression ratios may be represented by various metrics, as described below. The rate-distortion curve information may be stored as a table in memory for use in calculating compression parameters. Interpolation or curve-fitting of the measured compression ratio and distortion level points may be used to calculate intermediate points for the rate-distortion curve. A graph of the rate-distortion curve may also be displayed for the user. FIG. 6 illustrates an example of a rate-distortion curve, as described below.

The compression parameter generation block 110 may use the rate-distortion curve data to recommend an operating point and associated compression parameters for the compression algorithm. The compression parameter generation 110 may also receive parameters from user inputs 101. This allows the user to manually adjust the compression ratio or distortion level (R-D operating point) to different values than the one recommended by the profiler. The profiler then determines the associated compression ratio for the specified distortion level.

The profiler output 112 may provide the compression ratio and the compression parameters based on the user inputs 101. The profiler output 112 may be stored in memory, entered into a DMA descriptor 14 (described with respect to FIG. 8) or stored in a file.

The data characterization block 104, provides time domain and/or spectral domain analysis of the signal in the test data 10. Some results of the data characterization block may be provided to the profiler output 112 for display 120. In various embodiments, the following may be calculated and displayed as appropriate for the signal type and application.

Figure 5:
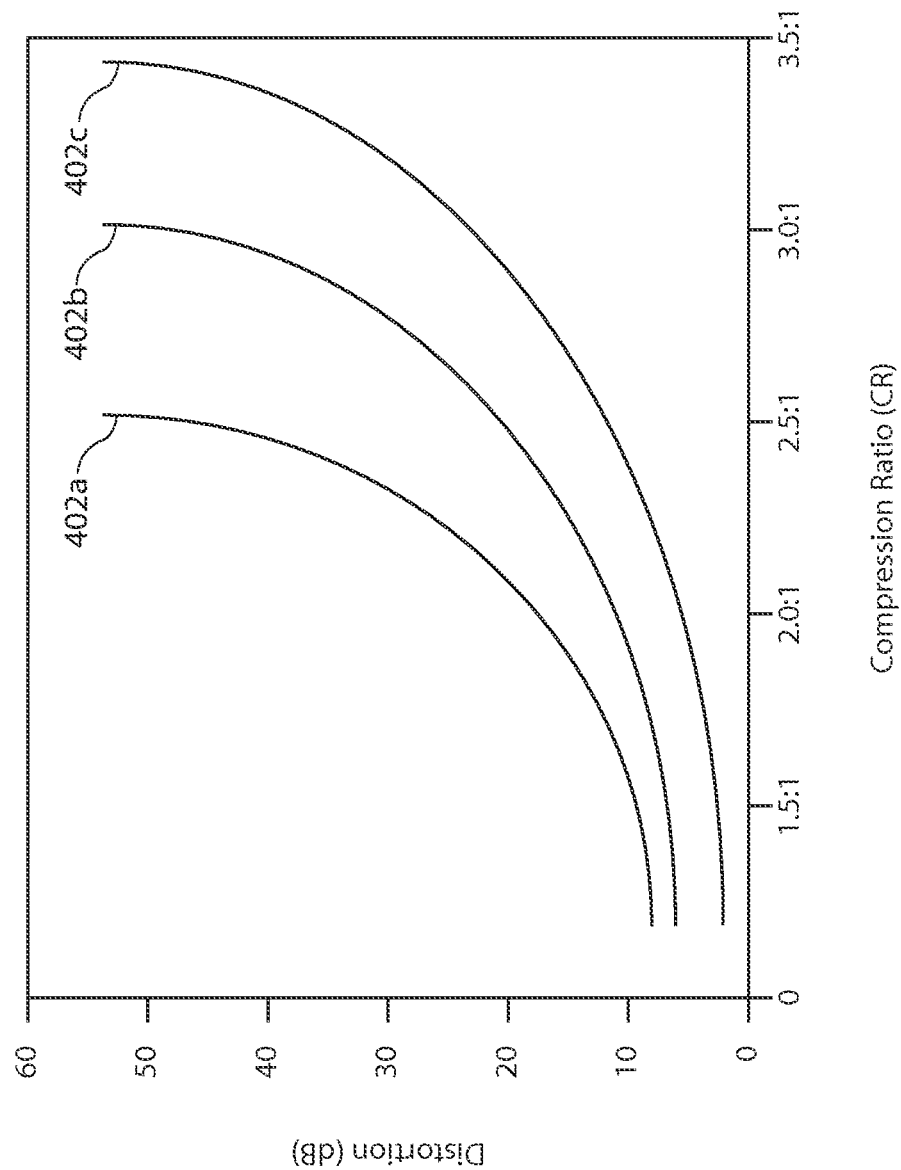
FIG. 5 illustrates rate-distortion curves for multiple compression algorithms.

The profiler output 112 for one-dimensional signals may provide one or more of the following for the display 120:
  i) Rate-distortion (R-D) curve, including a recommended operating point, such as those shown in FIGS. 5, 6 and 7a;
  ii) Textual description of R-D operating point, including the compression rate (specified in one or more formats) and the distortion (specified in one or more formats);
  iii) Spectra display pane, as shown in FIG. 4,
  iv) Time-domain results pane (input signal x vs. output signal y, or input signal x vs. distortion signal e, histogram of input signal x and output samples y; histograms of input and output signals and error samples, or other statistics derived from the x, y, and e samples).

The user may specify spectrum calculation parameters, such as FFT size, i.e. from 128 to 16384, 1024-pt FFTs, 50% overlap, Hanning or Hamming window, that determine the results shown in the spectra display pane for display 120.

The profiler output 112 for two-dimensional images may provide one or more of the following for the display 120:
  i) Rate-distortion display pane. The y-axis may use an image quality metric, such as the structural similarity matrix (SSIM) or peak signal-to-noise ratio (PSNR), described below, which are often used in image processing.
  ii) Error image display:
    For RGB, YUV, or YCrCb, the "error" image ("error" image=original image−decompressed image, pixel by pixel) displayed for one or more of the color planes may be selected by the user from an error pull-down menu.
    For Bayer matrix image data, a pull-down selection of original and decompressed image data may also select which color plane's error image is displayed, chosen from R, B, Gr or Gb (Bayer matrix data has four color planes).
  iii) The SSIM or PSNR metric calculated using the original and decompressed images may also be displayed.

As illustrated in FIG. 3, metrics of compression distortion may be computed in the time domain or the frequency domain. In the following, "x" represents the original signal/image data, i.e. of the test data 10, "y" represents the decompressed signal/image data after one pass of compression/decompression processing, and "e" represents a metric of the error signal (difference between the original and decompressed signal/image data).

Time-domain distortion metrics may include one or more of the following:
  1) Static time domain metrics (typically single values per {x, y} pair):
    a) Minimum (min)/mean/maximum (max)/variance (var)/ standard deviation (std) of individual sample array (x or y or e),
    b) Comparing the frequency-domain spectra of two sample arrays, x and y:
      i) Difference in min/mean/max/var/std signal levels of x and y,
      ii) Difference in min/mean/max/var/std noise levels of x and y,
    c) Comparing two sample arrays, x and e:
      i) Signal-to-Distortion ratio (=10*log 10(variance(x)/ variance(e)),
    d) Analyzing one sample array, e:
      i) Mean value of e (ideally should be close to zero),
      ii) Variance or standard deviation of e—related to the decrease in SNR of the decompressed signal compared to the original signal,
  2) Dynamic time-domain metrics of x, y, and/or e calculate the above metrics over N time windows, either overlapping or non-overlapping, to generate multiple values per waveform x, y, and/or e, where x includes the samples of test data 10. Window lengths and overlaps may be set to values appropriate for the application. For example, typical window lengths may be in the range from one thousand samples to one million samples, with window overlaps of 0% (no overlap), 25%, 50%, or 75%.

Frequency domain metrics may include one or more of the following:
  1) Static frequency-domain signal quality metrics:
    a) Analyzing power spectral density (psd) metrics of x, y or e:
      i) Signal-to-noise ratio,
      ii) Min/mean/max/var/std of psd samples,
      iii) Signal bandwidth or % bandwidth occupancy,
    b) Comparing the distribution of frequency bins, such as by generating histograms of psd values for two or more signals x, y, or e,
    c) Comparing two power spectral densities (x and y):
      i) Difference in signal-to-noise ratios ($SNR_x$ vs. $SNR_y$),
      ii) Difference in min/mean/max/var/std of signal levels in spectra (x vs. y),
      iii) Difference in min/mean/max/var/std of noise levels in spectra (x vs. y),
    d) Comparing two power spectral densities (x and e):
      i) Signal-to-distortion ratio (SDR),
      ii) Mean noise levels in spectra (x vs. e),
  2) Dynamic frequency-domain metrics measure the above metrics where the psd is calculated over N time windows, either overlapping or non-overlapping. Typical window lengths and overlaps may be set to values appropriate for the application.

FIG. 3 lists many methods for determining distortion 202 as a function of the input signal x, decompressed signal y and error signal e (=x−y). Comparisons may be made between the original data and the decompressed data (compare x and y) or the original data and the error data (compare x and e) to determine the distortion 202. Calculations of the distortion 202 may be performed in the time domain or the frequency (spectral) domain as described above. The frequency domain calculations may include the power spectral density (psd) of the input signal x, decompressed signal y and the error e=x−y. The power spectral density may be represented by the magnitude of a fast Fourier transform (FFT). The distortion 202 metrics may be absolute values or relative values (such as percentage values). Absolute metrics are calculated using the sample arrays themselves (without prior normalization of the samples). Relative metrics may be normalized to the range (−1.0, +1.0), converted to a percentage (0 to 100%) or converted to decibel (dB) units (logarithmic scale). Examples of such conversions may include:

SDR=10*log 10(variance($x$)/variance($e$))

Percent distortion=100*std($e$)/std($x$)

Normalized error=$e(i)/x(i)$, for $i=1 \ldots N$, where $N$ is number of samples in test data 10.

For image data, distortion measurements include peak SNR (PSNR) and structural similarity metric (SSIM). The most commonly used image quality metric is the peak signal-to-noise ratio (PSNR). In the case of image compression, the value to be quantified is the noise introduced by the compression-decompression process. When the original image is available, PSNR is calculated from the mean square error (MSE) of the pixel-by-pixel differences between the original image O and the "processed" image P, and max(Oi,j) is the largest pixel intensity:

$$MSE = 1/(mn) \sum_{i=1}^{m} \sum_{j=1}^{n} [O_{i,j} - P_{i,j}]^2$$

$$PSNR = 20 \log 10(\max(Oi, j)/sqrt(MSE))$$

Structural similarity combines three separate image quality features (intensity, contrast, and structure) to generate a quantitative metric of image quality. The SSIM metric is a value between 0.0 and 1.0, where larger SSIM values indicate a higher degree of similarity between images x and y. Structural similarity S(x, y) between two images x and y is the product of three feature metrics, where μx and μy represent the local sample means of images x and y; $\sigma_x$ and $\sigma_y$ represent the local standard deviations of images x and y; and $\sigma_{xy}$ represents the local cross-correlation of images x and y after subtracting their means. The local mean, local standard deviation and local cross-correlation are calculated for the pixel values in local regions of the images. A local region is a block of pixels having dimensions, such and 10×10, or any appropriate dimensions. The blocks of pixels may be overlapping or non-overlapping.

$$S(x, y) = l(x, y) \cdot c(x, y) \cdot s(x, y)$$

$$= \left( \frac{2\mu_x \mu_y + C_1}{\mu_x^2 + \mu_y^2 + C_1} \right) \cdot \left( \frac{2\sigma_x \sigma_y + C_2}{\sigma_x^2 + \sigma_y^2 + C_2} \right) \cdot \left( \frac{\sigma_{xy} + C_3}{\sigma_x \sigma_y + C_3} \right).$$

The constants C1, C2, and C are small, positive constants added to guarantee numerical stability in cases where the terms approach zero. The first term l(x, y), referred to as a luminance term, is a function of the local means of the images being compared. The contrast term c(x, y), the second term in Equation 4, reflects the local contrast-to-noise ratio, which is affected by the local spatial frequency. The third term s(x,y), referred to as a structure term, measures the structural similarity (cross-correlation) between local regions. The SSIM metric may include the product of all three terms for S(x, y). Alternative forms of the SSIM metric may include a single one of the three terms luminance l(x, y), contrast c(x, y) or structure s(x, y), or the product of any two of the three terms l(x, y), s(x, y) and c(x, y).

FIG. 4 illustrates an idealized representation of the spectrum of a signal 300, its noise floor 306, peak power 302, and center frequency 308. The data characterization block 306 may calculate the noise floor 306 for the test data 10. The compression algorithm selected by algorithm selection block 106 may be applied to the data set 10 to test one or more compression ratios or distortion levels. The rate-distortion curve generation block 108 measures the distortion at each of the compression ratios or distortion levels to generate distortion levels 314. In this example, the distortion levels 310 and 314 are frequency domain measurements of the power spectral density of the error e, or psd(e). A compression algorithm that uses an attenuator to control the quantization of input signal x in the process of forming the compressed signal y (as described below with respect to FIG. 13) will generate error signals e having flat distortion spectra, such as distortion levels 314a-n. For some compressed signals, distortion levels may vary substantially over time, i.e. the distortion levels 314a-n may rise and fall when the psd(e) is measured over time. A dynamic profiler that makes multiple measurements of the distortion levels over multiple time windows to track time-varying distortion levels, as described below with respect to FIGS. 15a, 15b and 15c.

FIG. 4 shows multiple distortion levels 310 below the noise floor 306 for selected compression ratios 312, where distortion levels 314a, 314b, etc. result when compression ratio 312a, 312b (respectively) are chosen. Increasing compression ratio 312 results in an increased distortion level 314. In one embodiment, the profiler 100 may set a recommended distortion level to an offset 314 below the noise floor 306 and determine the resulting compression level or compression ratio A 316. A preferred offset 314 is at least 6 dB. It is also possible that the distortion level 314m may be set above the noise floor 306, resulting in a higher compression ratio 312m. In some applications, a distortion level above the noise floor may still provide adequate decompressed signal quality.

Methods for estimating the noise floor 306 include:
  a. Smallest magnitude of spectrum (minimum FFT bin).
  b. Calculate FFT of the signal and create FFT bins sorted from smallest magnitude to the largest magnitude and from the total bins take 20% of those having the smallest amplitudes and calculate the average magnitude of those bins.
  c. Create a histogram of magnitude values of the FFT of the signal, the histogram having histogram bins from the minimum magnitude to the maximum magnitude, then calculate the mode (most frequent histogram bin) which represents the noise floor.

Other methods for estimating the noise floor are described in the '533 patent.

FIG. 5 illustrates rate-distortion curves for multiple compression algorithms available to the algorithm selection block 106. Each rate-distortion curve 402a, 402b and 402c represents the compression distortion as a function of the compression ratio (or other measure of the compression level) and is associated with a particular compression algorithm. For example, a more computationally efficient (less complex) compression algorithm may exhibit a worse rate-distortion curve 402a, while a more complex algorithm produces a better rate-distortion curve 402b or 402c. In addition, each compression algorithm may have different performance parameters which include:
  a. Software algorithm complexity measured in instructions per second (MIPS requirements), b. Hardware algorithm complexity, measured in silicon area for implementation by application specific integrated circuit (ASIC) or system-on-chip (SoC) or number of programmable logic elements for implementation in field-programmable gate arrays (FPGAs),
c. Power consumption
d. Latency
e. Memory usage
f. Processing speed An example of algorithm complexity selection is further described with respect to FIGS. 8 and 11, where C_MODE parameter 106 allows users to select from a low-complexity floating-point data compression algorithm (FP2), a medium-complexity floating-point data compression algorithm (FP4), and a high-quality/higher complexity floating-point data compression algorithm. The user inputs 101 may provide performance parameters to the algorithm selection block 106. The algorithm selection block 106 may include a table stored in memory that relates the performance parameters to compression algorithms, supporting a compression algorithm selection based on the above performance parameters.

FIG. 6 illustrates an example of a rate-distortion curve 500 in relation to the calculated noise floor 306. The compressor/decompressor block 118 applies the selected compression algorithm to the test data 10 for multiple compression ratios to produce compressed test data for the distortion measurements. The rate-distortion curve generation block 108 measures the distortion 314 at the various compression ratios 312 to generate rate-distortion points 502. In the example of FIG. 6, the set of test data 10 is compressed and decompressed four times, using four different compression ratios 512a-n to generate the points 502a-d, having corresponding distortion levels 514a-n, respectively.

The rate-distortion curve generation block 108 may measure the compression results for a lossless mode, fixed quality mode, or fixed rate mode. In the lossless mode, the distortion is zero so the rate-distortion curve generation block 108 measures the resulting compression ratio, such as 312n. For the fixed quality mode, the distortion may be related to a compression control parameter (such as an attenuator setting for the compressor 118), and the resulting compression ratio is displayed on the rate-distortion curve. For the fixed rate mode, the compression ratio is fixed and the resulting distortion ratio is displayed on the rate-distortion curve. The rate-distortion curve generation block 108 uses the measurement points 502a-d to create the rate-distortion curve 500. Any curve fitting scheme may be used, including a simple straight line fit between the measurement points 502a-d to generate the rate-distortion curve 500. An important feature of the rate-distortion curve is that there can be a large number, theoretically an infinite number, of rate-distortion operating points 508 along this curve so the user is not limited to a single or limited number of compression ratios. In fixed rate mode, a compression ratio 506 does not need to be an integer value but can be any value that meets the compression ratio 506 selected by the user. In fixed quality mode, a distortion level 504 does not need to be an integer value but can be any value that meets the distortion level 504 selected by the user.

In one embodiment, the compression ratio (CR) is incremented from the lossless CR to generate seven measurement points for the rate-distortion curve, such as the following:
Lossless [resulting in a compression ratio of LosslessCR]
Ceil(LosslessCR)+0.5,
Ceil(LosslessCR)+1.0,
Ceil(LosslessCR)+1.5,
Ceil(LosslessCR)+2.0,
Ceil(LosslessCR)+2.5,
Ceil(LosslessCR)+3.0

Preferably the selected compression ratios for the measurement points 502 encompass the desired distortion level for the recommended operating point 508.

In a preferred embodiment, the profiler may set a recommended operating point 508 so that the resulting distortion 504 is at least 6 dB below the noise floor 306. The value 6 dB corresponds to 1 bit of the data sample. As such, the recommended operating point 508 with a distortion of at least 6 dB below the noise floor 306 corresponds to distortion loss in the "noisy" bits of the original sample. Thus, the compression distortion of the decompressed samples is lower than the noise floor 306 of the original signal samples. Returning to the example of FIG. 6, the noise floor 306 is 39.6 dB, thus the distortion for the recommended operating point 508 is 33.6 dB and the corresponding compression ratio, determined from the rate-distortion curve, is 2.9:1. The points 502a-c and any other point along the rate distortion curve 500 that are less than the noise floor level 306 correspond to compression distortion in the noisy bits of the original samples. The operating point 502d and other operating points above the noise floor level 306 correspond to compression distortion within the effective bits of the signal in the original samples. The relation between the effective bits and noisy bits in the original samples is further described with respect to FIG. 8.

Alternatively, manual input of a distortion level to the compression parameter generation 110 step is an option that allows the user to change the default distortion level or compression ratio recommended by the profiler. The profiler may then calculate the compression ratio corresponding to the input distortion level for the selected compression algorithm based on the algorithm's associated rate-distortion curve 402 in FIG. 5.

Figure 7:
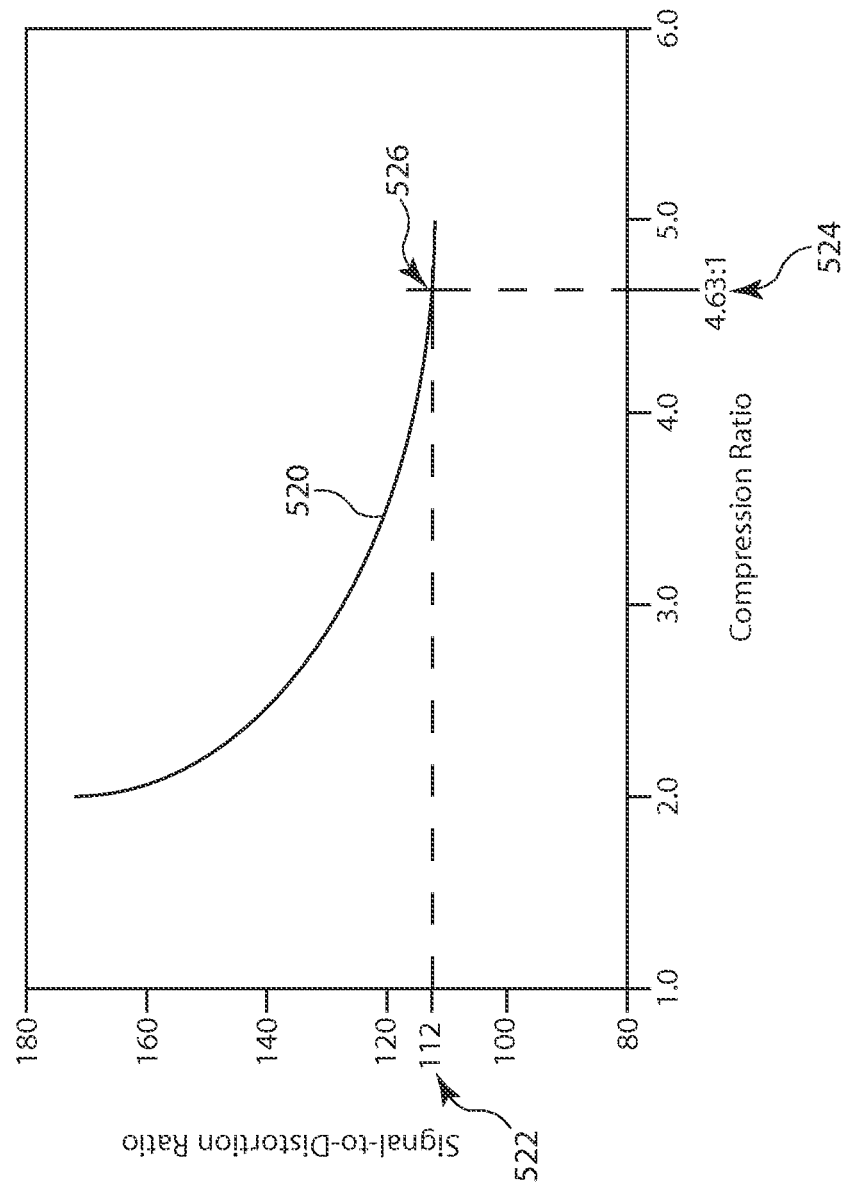
FIG. 7 illustrates another example of a rate-distortion curve that plots the signal-to-distortion ratio (SDR) versus the compression ratio.

FIG. 7 illustrates another example of a rate-distortion curve 520 that plots the signal-to-distortion ratio (SDR) versus the compression ratio. This rate-distortion curve 520 is an alternative representation of a compression distortion metric versus a compression ratio metric. The compression ratio can be a relative or absolute measure of the number of bits in the compressed data, including, but not limited to the following:
a. The ratio of the number of bits in the uncompressed original data set and the number of bits in the compressed data set;
b. Percent of original: number of bits in the compressed data/number of bits in the original data;
c. Percent savings: (number of bits in the original data−number of bits in the compressed data)/(number of bits in the compressed data);
d. Number of bits in the compressed data set; and
e. Average number of bits per sample in the compressed data set.

The distortion level in this example is given by the SDR. The rate-distortion curve 520 shows that the SDR decreases with increasing compression ratio. The operating point 526 has the corresponding SDR 522 of 112 dB and compression ratio 524 of 4.63:1. Other metrics of distortion include, but are not limited to, the following:
a. Percent uncertainty—comparison of the uncertainty in the original and decompressed samples, calculated by std(error)/std(signal)(×100 for percent),
b. Effective number of bits (ENOB)—number of bits above the noise level of the samples, comparison of the ENOB of the original and decompressed samples, for original samples ENOB=SNR/6.02, for decompressed samples ENOB=SDR/6.02,
c. Number of significant digits—comparison of significant digits (decimal) in the original and decompressed samples, calculated by ENOB/3.3.

FIG. 8 illustrates the relationships between the effective bits of an uncompressed and compressed signals, noise floor and distortion. The graph 700 displays an original (uncompressed) signal histogram 704 and an error histogram 702. The histograms are both mapped to a log base 2 horizontal axis. The signal histogram 704 is calculated as follows:

a. Compute the magnitudes of the original signal samples x,
b. Remove zero values (prevent "infinity" in log calculation),
c. Compute the log base 2 of the magnitudes,
d. Compute the histogram of the log base 2 values.

The histogram 704 of log base 2 values indicate the frequency of maximum bit locations occupied by the signal samples. The error histogram 702 is calculated as follows:

a. Calculate the compression error samples e=x−y, where y represents the decompressed sample corresponding to the original sample x,
b. Compute the magnitudes of the error samples e,
c. Remove zero values,
d. Compute the log base 2 of the magnitudes of e,
e. Compute the histogram of the log base 2 values.

The histogram 702 of log base 2 values indicate the frequency of maximum bit locations occupied by the error samples. Comparison of the histograms 702 and 704 indicates that the compression error is located in bits that are below the signal range for this example.

The graph 701 illustrates the bit registers for the mantissa of an integer representation of a sample. The effective bits of an original signal sample are the bits above the noise bits of the sample. The effective number of bits (ENOB) of the original sample is calculated by the SNR (dB) of the original samples divided by 6.02 (dB per bit). For this example, effective bits of the original samples would occupy a range indicated by the most significant bit (MSB) to the noise floor 306. The bits below the noise floor 306 to the least significant bit (LSB) are noisy bits of the original sample. The recommended distortion level 504 corresponds to 6 dB below the noise floor, within the noisy bits illustrated in the graph 701. The ENOB of the decompressed samples is calculated by the SDR divided by 6.02, where the distortion is measured by the compression error e=y−x. The decompressed sample has effective bits that encompass some of the noisy bits of the original sample. For this example, the compression conserves the effective bits of the original samples and the distortion bits of the decompressed samples are within the noisy bits of the original samples. This example illustrates that selecting an operating point below the noise floor of the original signal will preserve the effective bits of the original samples and confine compression distortion to the noisy bits.

Once an operating point on an R-D curve has been chosen, the corresponding compression control parameters are then determined, including the compression algorithm selection (402), compression mode (fixed rate or fixed quality or lossless), and compression setting (in fixed-quality mode, the attenuator setting; in fixed-rate mode, the target compression ratio).

The profiler output 112 may provide parameters to the compressor 18 to be applied to the production data 16. In various embodiments, the parameters may be provided via a DMA descriptor or an API for configuration of compression operations to be applied by the compressor 18 to the production data 16.

An API, including a set of operations and parameters for the operations, may provide for data compression and decompression. The set of operations can be implemented in the data processor using software-implemented functions, which can be hardware-assisted, configured to use the parameters and perform the operations of the API. Parameters of the API can include indicators of data type, size of a sample set, and compressed packet location (destination for a compression operation, source for a decompression operation), uncompressed location (destination for a decompression operation, source for a compression operation), and a selected compression mode, such as lossless, fixed rate, or fixed quality modes. The profiler output 112 may provide compression parameters to the API. Operations of the API include engines that move data between the compressed data location and the uncompressed data location, in conjunction with which one of compression and decompression is performed, as specified by parameters of the API. Data in an uncompressed location as the term "uncompressed" is used herein can refer to data which can be provided as input to a compression engine, such as the production data 16, or as data output from a decompression engine, including never-compressed data or previously compressed and then decompressed data. A set of different compression and decompression algorithms can be included in the operations of the API, and compression parameters of the API can identify a selected one of the different algorithms to be applied for compression and decompression operations in a particular data move operation. The set of different algorithms can include algorithms specialized for data types identified in the parameters of the API, including for example algorithms for compression of floating-point numbers, algorithms for compression of integers, algorithms for compression of image data, and so on. Also, the set of different algorithms can include algorithms specialized for compression qualities as identified in the compression parameters of the API, such as lossless compression, lossy compression of different types, compression to achieve specified compression ratios, algorithms that maintain specified limits on compression quality in terms of loss of data, and so on. The data processor can execute application programs that utilize the API for configuring the compressor 18. Users can develop user application programs that rely on the API, without being burdened by the specific configuration of a hardware platform on which the user application is to be executed. Providing compression parameters via an API is further described in the '898 application.

FIG. 9 illustrates an example of the parameters stored in a DMA descriptor 14 for storage of the parameters for the compressor 18. The profiler output 112 provides parameters that may be stored in the DMA descriptor 14 associated with the or in memory for future use. Some of the parameters listed in the DMA descriptor 14 are provided by the user or a host program. For example, the user or host program may provide the parameter groups 602 and 604. Packet Length (PKT_LENGTH) denotes the number of samples per packet, wherein for non-image type data the default is 256 samples per packet and for imaging the default is raster or row length. Data Type (D_TYPE) denotes the type of data being compressed along with the number of bits per sample, and for image data the color space decimation and any color space conversion. The profiler output 112 may provide settings for the parameter group 604, including RR_CONFIG parameters and MODE parameters. In this example, the parameter group 604 includes the parameters used for the compression operations by a preferred embodiment of the compressor 18, as described below with respect to FIGS. 13 and 14. The RR_CONFIG parameters configure the compression operations of a "redundancy remover" (RR), described below. The compression mode (MODE) stores the type of compression, lossless or lossy, and associated parameters related to user selection 106. Parameter C_MODE reflects user selection 106, while parameter C_PARAM reflects the target compression ratio 506 in fixed-rate mode, or the target distortion level 504 in fixed-quality mode. The DMA descriptor 14 and its application for providing compression parameters are described in the '205 application. In various embodiments, the profiler output 112 may provide a text (.txt) file that is used to set up a DMA descriptor or a binary file associated with the production data 16.

Figure 10:
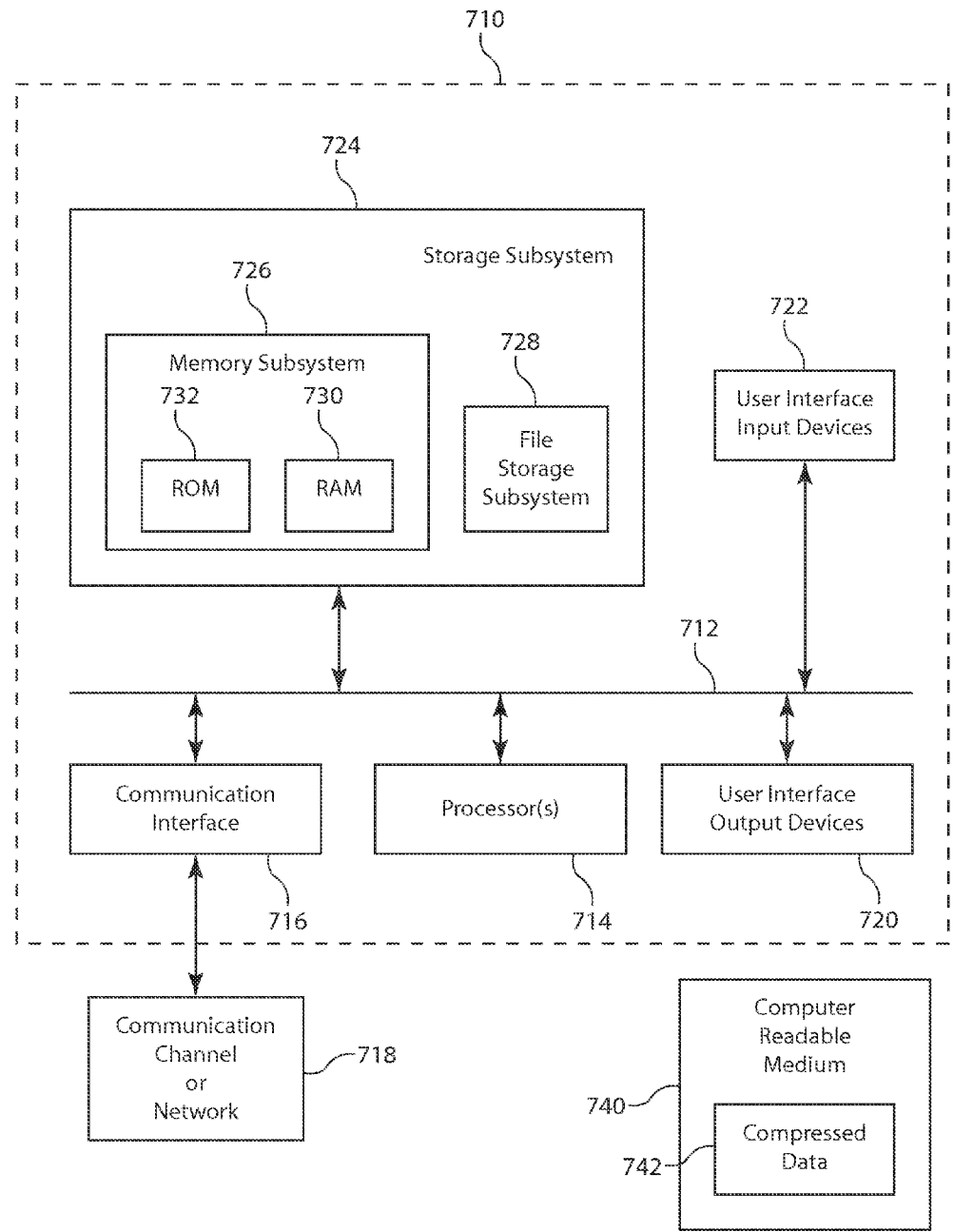
FIG. 10 is a block diagram of a computer system suitable for use with embodiments of the profiler to determine parameters for compression of numeric data.

FIG. 10 is a block diagram of a computer system suitable for use with embodiments of the profiler 100 to determine parameters for compression of numeric data. Computer system 710 typically includes at least one processor 714 which communicates with a number of peripheral devices via bus subsystem 712. These peripheral devices may include a storage subsystem 724, comprising a memory subsystem 726 and a file storage subsystem 728, user interface input devices 722, user interface output devices 720, and a communication interface subsystem 716. The input and output devices allow user interaction with computer system 710. Communication interface subsystem 716 provides an interface to communication channel or network 718, which may be a single channel or a communication network having multiple channels. The communication channel or network 718 is coupled to corresponding interface devices in other computer systems, transmitting or receiving devices, or an outside network (not shown). The communication channel or network 718 may comprise wireline links, optical links, wireless links, or any other mechanisms for communication of information. The communication network 718 may comprise many interconnected computer systems and communication links. While in one embodiment, communication network 718 is the Internet, in other embodiments, the communication network 718 may be any suitable computer network.

User interface input devices 722 may include a keyboard, pointing devices such as a mouse, trackball, touchpad, or graphics tablet, a scanner, a touch screen incorporated into the display, audio input devices such as voice recognition systems, microphones, and other types of input devices. In general, use of the term "input device" is intended to include all possible types of devices and ways to input information into computer system 710 that may be suitable for providing user inputs 101 to the profiler 100.

User interface output devices 720 may include a display subsystem, a printer, a fax machine, or non-visual displays such as audio output devices. The display subsystem may include a cathode ray tube (CRT), a flat-panel device such as a liquid crystal display (LCD), a projection device, or some other mechanism for creating a visible image, suitable for the display 120 of the profiler output 112. The display subsystem may also provide non-visual display, such as via audio output devices. In general, use of the term "output device" is intended to include all possible types of devices and ways to output information from computer system 710 to the user or to another machine or computer system.

Storage subsystem 724 stores the basic programming and data constructs that may provide some or all of the functions for the profiler 100, compression and/or decompression described herein. These software modules are generally executed by processor 714. The processor(s) 714 may include one or more of a DSP, microprocessor, microcontroller, central processing unit (CPU) or graphics processing unit (GPU), or a combination of these devices. The processor(s) 714 may also include dedicated application specific integrated circuit (ASIC) or field-programmable gate array (FPGA) logic implementing some or all of the floating-point compression and/or decompression functionality.

Memory subsystem 726 typically includes a number of memories including a main random access memory (RAM) 730 for storage of instructions and data during program execution and a read only memory (ROM) 732 in which fixed instructions are stored. File storage subsystem 728 provides persistent storage for program and data files, and may include a hard disk drive, a floppy disk drive along with associated removable media, a CD-ROM drive, an optical drive, or removable media cartridges, including Universal Serial Bus (USB) thumb drives with USB interface and flash media storage. The databases and modules implementing the functionality of certain embodiments may be stored by file storage subsystem 728.

Bus subsystem 712 provides a mechanism for letting the various components and subsystems of computer system 710 communicate with each other as intended. Although bus subsystem 712 is shown schematically as a single bus, alternative embodiments of the bus subsystem may use multiple busses.

Computer readable medium 740 can be a medium associated with file storage subsystem 728, and/or with communication interface subsystem 716. The computer readable medium 740 can be a hard disk, a floppy disk, a CD-ROM, an optical medium, removable media cartridge, USB thumb drive, flash media storage, or electromagnetic wave. The computer readable medium 740 is shown storing a compressed data file 742. The computer readable medium may also store programs implementing the functions of compression, decompression and/or the profiler 100.

Computer system 710 itself can be of varying types including a personal computer, a portable computer, a workstation, a computer terminal, a network computer, a mainframe, a television, a smart phone, a tablet computer or any other data processing system or user device. Due to the ever-changing nature of computers and networks, the description of computer system 710 depicted in FIG. 10 is intended only as a specific example for purposes of illustrating the preferred embodiments. Many other configurations of computer system 710 are possible having more or fewer components than the computer system depicted in FIG. 10.

Figure 11:
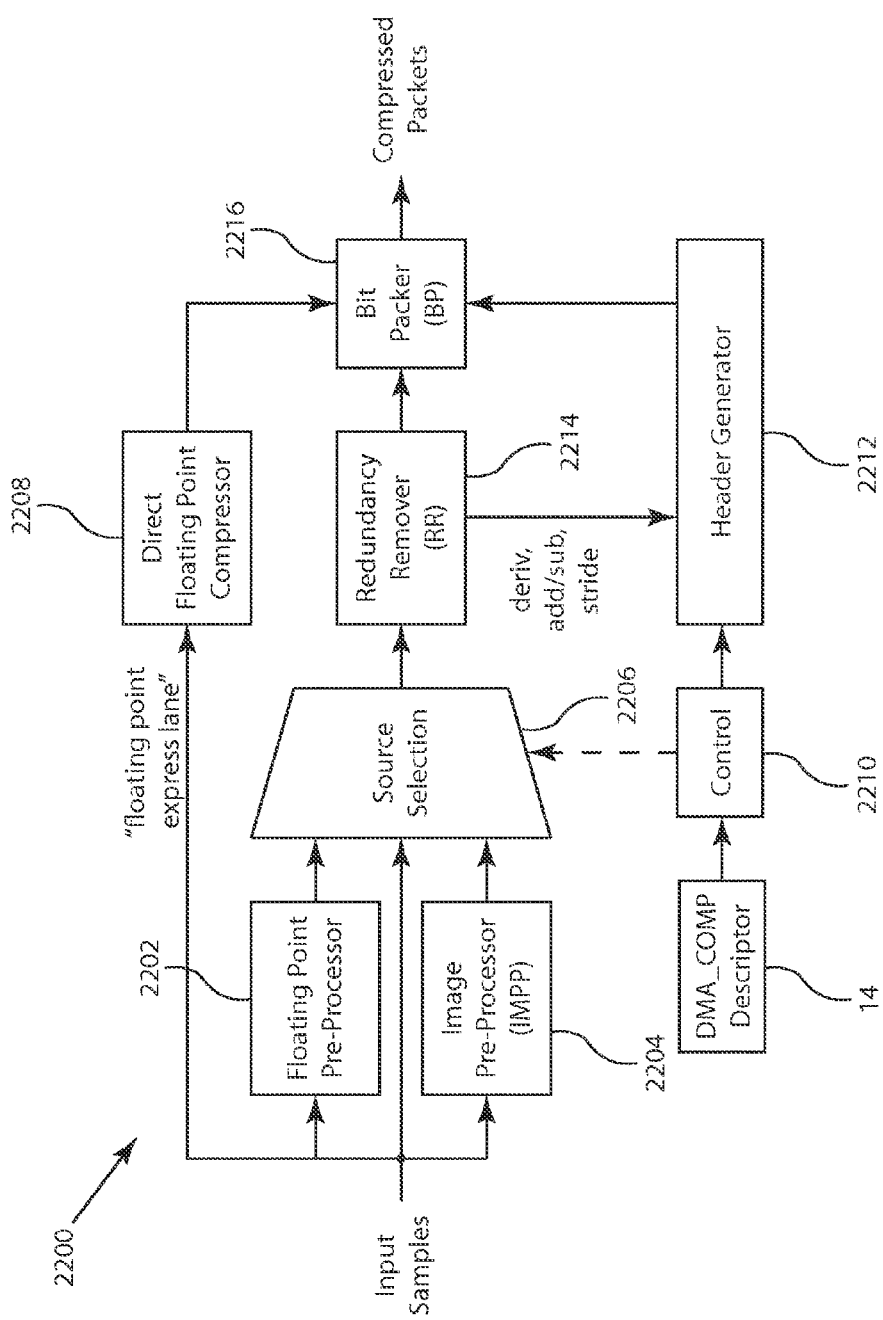
FIG. 11 illustrates a compressor according to a preferred embodiment.

FIG. 11 illustrates a compressor 2200 according to a preferred embodiment for compressors 18 and 118. The user inputs 101 to the profiler 100 may provide data format information 11, including a data type identifier D_TYPE in the DMA descriptor 14 (FIG. 9). The compressor 2200 applies the appropriate compression operations for the data type. The profiler 100's algorithm selection block 106 may select the compression algorithm via the C_MODE parameter 106 in the DMA descriptor 14 to be applied by the compressor 2200. The profiler 100's compression parameter generation block 110 may provide parameters for configuring the operations of the selected algorithm, the C_PARAM parameters in the DMA descriptor 14. The DMA descriptor 14 or an API may provide the parameters from the profiler output 112 to the controller 2210 for configuring the operations of the compressor 2200 for application to the production data 16. The compressor 2200 may apply multiple compression tests of the test data 10 when operating as the compression block 118 in the configuration shown in FIG. 2. The compression parameters will configure the compressor 2200 to provide the multiple distortion levels and compression ratios. The compressed test data compressed test data is then decompressed and further processed by the rate-distortion curve generation 108 as described above.

The compressor 2200 comprises the following blocks:
  Floating Point Pre-processor 2202 to convert data types between 32-bit and 64-bit floating-point samples and 32-bit integer samples, Image Pre-Processor 2204, for RGB, YUV, and Bayer matrix image data,
Redundancy Remover (RR) 2214,
Bit packer (BP) 2216,
Header Generator 2212,
Direct Floating Point Compressor 2208 (lossy only & low latency),
Controller 2210

For example, when the user selects lossless floating point mode, the floating point pre-processor 2202 converts floating-point samples to integer samples. Preferably, both 32-bit single-precision floats and 64-bit double-precision floating point samples may be converted to 32-bit integer samples. The floating point pre-processor 2202 is further described in the '061 application. The source selector 2206 selects the integer samples for compression by the redundancy remover 2214, based on control parameters received from the controller 2210.

The direct floating-point compressor 2208 provides direct compression of the floating-point samples, without first converting the floating-point samples to integer samples. The direct floating-point compressor 2208 produces lower latency and lower complexity than conversion followed by integer compression. Alternative compression modes for direct floating-point compression that may be implemented by the direct floating-point compressor 2208. Two of these compression modes, referred to herein as FP2 and FP4, apply thresholds to the exponents of the floating-point samples to categorize the floating-point samples. The FP2 mode applies one threshold to generate two classes, or "buckets". The FP4 mode applies three thresholds to generate 4 classes, or "buckets". Varying amounts of compression are applied to floating-point samples based on their class. The profiler 100's algorithm selection block 106 may provide performance parameters for used for selecting the compression mode. The selected compression mode may be indicated by the C_MODE parameter 106 in the DMA descriptor 14. The compression operations for the direct floating-point compression are described in the '330 application.

The image pre-processor (IMPP) 2204 processes various imaging data formats, including, Red-Green-Blue (RGB), Intensity & Chroma (YUV) and image sensor pixels (Bayer matrix). These imaging data formats are a special integer sub-type. The image pre-processor 2204 reformats the image samples to a one-dimensional, color component-interleaved stream of integers. The source selector 2206 selects the image sample stream for compression by the redundancy remover 2214, based on control parameters received from the controller 2210. The user input of data type information 11 provides the D_TYPE parameters to the DMA descriptor 14 used to configure the image pre-processor 2204.

In this embodiment, the redundancy remover (RR) 2214 uses a signed 32-bit integer internal data path, generates two redundancy-removed alternatives and then determines whether the samples themselves, or one of the two redundancy-removed alternatives would result in the best compression. The redundancy remover 2214 calculates the number of bits per compressed packet for each of the alternatives and selects the one having the fewest bits. The alternative selected for the next packet(i+1) may be performed at the end of a current packet(i). The selected alternative is stored in the packet header of next packet(i+1) and will provide a control parameter for decompression operations. The redundancy remover 2214 produces compressed integer samples for the bit packer 2216.

The profiler 100's data characterization block 104 may include a center frequency estimator that for 1D signals to set RR-internal control parameters STRIDE1, STRIDE2, ADD_SUB, and FIFO2_SEL based on the estimated center frequency value. For example, a center frequency estimator may select one of six frequency bands: DC, $f_s/8$, $f_s/6$, $f_s/4$, $f_s/3$, and $f_s/2$, where $f_s$ is the sample rate. These bands determine the control parameters STRIDE1, STRIDE2, FIFO2_SEL and ADD_SUB values that control the redundancy remover (RR) 2214 and add/subtract elements. The center frequency estimator operates over a programmable number of input samples (typically 256 or 1024). Aspects of the redundancy remover 2214 are described in the '533 patent. The redundancy remover 2214 is described in more detail below with respect to FIG. 13.

For input data that does not exhibit a center frequency, such as image data, the profiler 100's user inputs 103 may select the parameters STRIDE1, STRIDE2, FIFO2_SEL and ADD_SUB for the redundancy remover (RR) 2214. The RR_CONFIG parameters of the DMA descriptor 14 may provide these parameters for the compressor 18 for application to the production data 16.

The bit packer 2216 may apply block floating point encoding to the compressed integer samples output from the redundancy remover 2214. The bit packer 2216 and the header generator 2212 may be applied by the compressor 18 when the production data 16 is being compressed to form compressed data packets. The header generator 2212 may include some of the RR_CONFIG and MODE parameters that would be used for decompression operations. For the compressor 118 applied by the profiler 100, the bit packer 2216 may be applied to determine the number of bits of the compressed test data without actual formation of compressed packets. The block floating point encoding groups the compressed integer samples and encodes 1 or 2 block exponents with every group of 4 or 8 mantissas. The block exponents (or more specifically, exponent differences) are encoded in pairs when possible and as absolute exponents when they cannot. The exponent tokens are preferably 4 or 8 bits long. The block floating point exponent encoding exploits correlation between the block exponents to minimize the number of bits required to encode them. The exponent tokens are followed by reduced mantissas corresponding to the encoded group. Each of the reduced mantissas in a group contain the same number of bits, indicated by the block exponent for the group. The '245 application describes embodiments of the block floating point encoding that may be implemented for the bit packer 2216.

Figure 12:
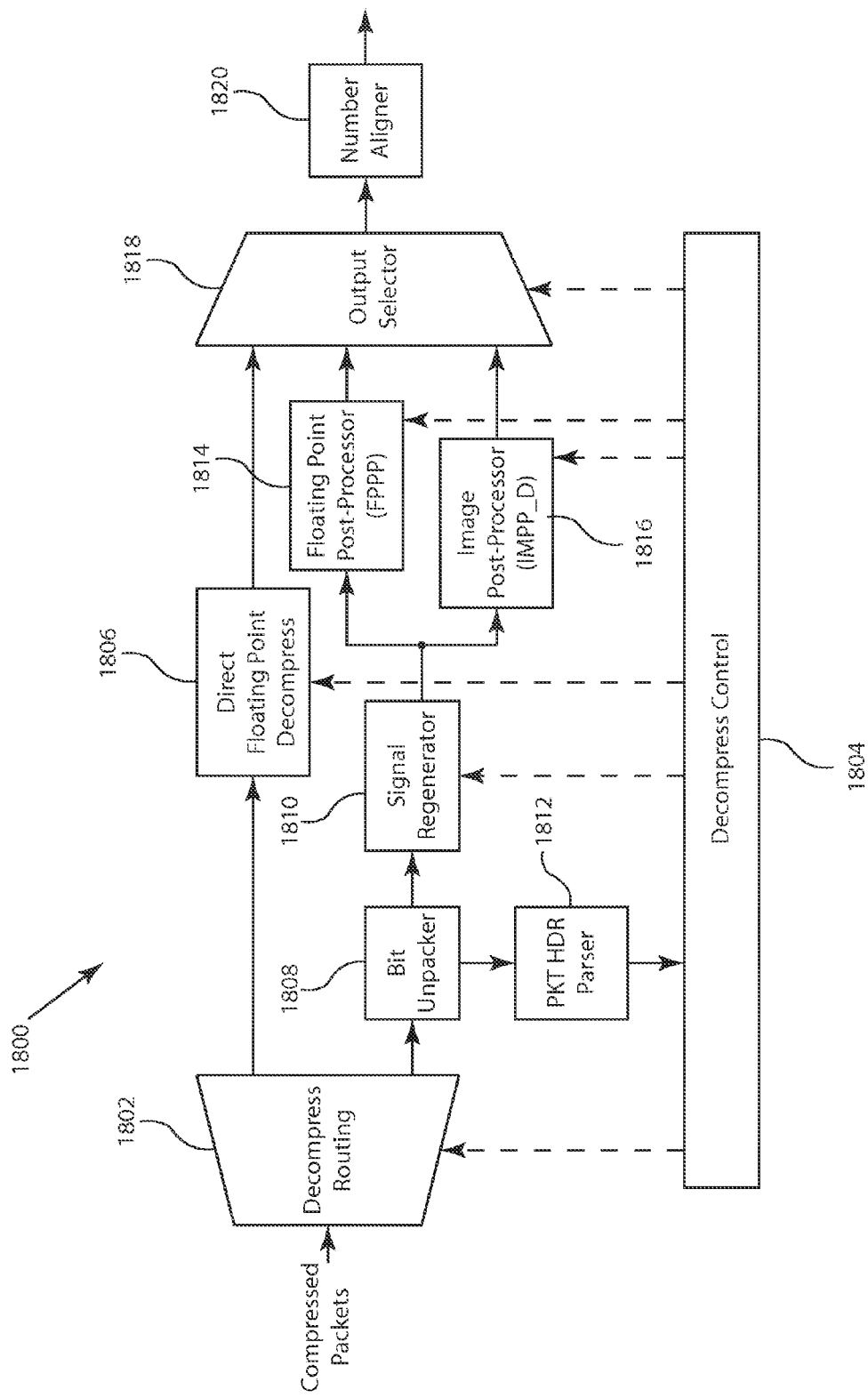
FIG. 12 illustrates a decompressor according to a preferred embodiment.

FIG. 12 illustrates a decompressor 1800 according to a preferred embodiment for the decompressor 118. The decompressor 1800 performs the inverse operations of the compressor 2200. The decompressor 1800 may be applied to the compressed test data as the decompression block 118 to form the decompressed test data for processing by the rate distortion curve generation block 108 (FIG. 2). The decompressor 1800 may also be applied to the compressed production data to provide decompressed data as needed for the application.

The bit unpacker 1808 decodes each packet header 2100 to extract control parameter information for decompression operations. The bit unpacker 1808 applies block floating point decoding to each packet's compressed groups of exponent tokens and reduced mantissas. The exponent token for the block floating point encoding group indicates the number of bits for each mantissa in the group. The '245 application describes embodiments of the block floating point decoding that may be implemented for the bit unpacker 1808.

The packet header parser 1812 accepts 48 bits from a parser component of the bit unpacker 1808. After verifying a SYNC word, the packet header parser 1812 retrieves the control parameters STRIDE1, ADD_SUB, DERIV, and INT_OR_

FLOAT fields and distributes them to the decompressor logic blocks that require these parameters. The packet header parser 1812 extracts the various control parameters (such as ATTEN, STRIDE1, ADD_SUB, and DERIV) from each packet header 2100 and configures the signal regenerator 1810 accordingly. Alternatively, the profiler 100's user inputs 103 may provide the parameters for the signal regenerator 1810. For compressed test data where packets may not have been formed, the user inputs 103 may provide the parameters for decompression and the packet header parser 1812 may be bypassed. The signal regenerator 1810 reverses the derivative and attenuator actions of the redundancy remover (RR) 2214. The signal regenerator 1810 retrieves several of its control parameters from each packet header 2100, including STRIDE1, ADD_SUB, DERIV, and ATTEN. Where the redundancy remover 2214 subtracted samples, signal regenerator 1810 adds them. Where the redundancy remover 2214 added samples, the signal regenerator 1810 subtracts them. Where the redundancy remover 2214 attenuated samples, the signal regenerator 1810 amplifies them.

The direct floating point decompressor 1806 decompresses the compressed data, such as from the FP2 and FP4 modes, and reconstructs floating-point data. The '981 application describes decompression to reconstruct the floating-point data for several alternative compression modes that may be implemented by the direct floating-point decompressor 1806.

The floating point post-processor 1814, which receives its input from the signal regenerator 1810, regenerates an approximation to the original floating-point values that were input to the floating point pre-processor 2202.

The image post-processor 1816 regenerates an exact (or approximate) representation of the color components that were input to the image pre-processor 2204. For example, if the image pre-processor 2204 performed chroma downsampling, image post-processor 1816 performs chroma upsampling. If the image pre-processor 2204 performed color space conversion, the image post-processor 1816 performs color space re-conversion. The decompression controller 1804 provides the control parameters to configure the operations of the image post-processor 1816.

The output selector 1818 selects an input from the direct floating-point decompressor 1806, the floating point post-processor 1814, or image post-processor 1816 and provides the selected data to the number aligner 1820.

The number aligner 1820 accepts 32, 64, 128, or 256 bit units from the output selector 1818 and separates (demultiplexes) them into sample-wide units. The number aligner 1820 uses the control parameter D_TYPE to properly separate the 32-bit input bits into 1, 2, 4, or ½ sample values, depending on the data type of the output samples and the width of the bus at the output of the number aligner 1820. When the decompressor 1800 is applied to the compressed test data, the decompressed test data provide the decompressed signal y used for calculating distortion for the rate-distortion curve, as described above.

Figure 13:
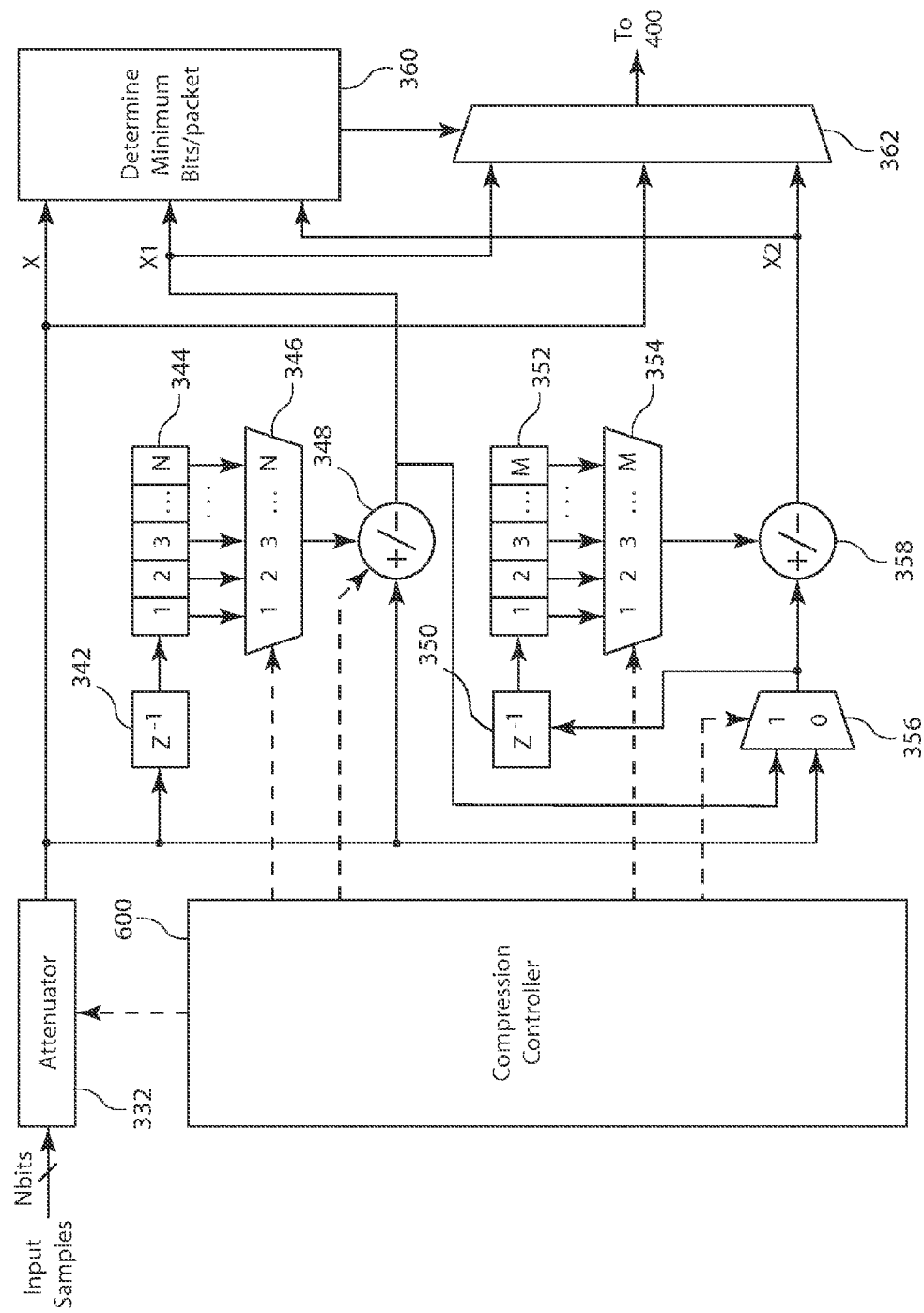
FIG. 13 illustrates an adaptive compressor architecture for the redundancy remover of FIG. 10, with an attenuator, as used in one example system for integer compression.

FIG. 13 illustrates an adaptive compressor architecture for the redundancy remover 2214 of FIG. 10, with an attenuator, as used in one example system for integer compression. The controller 2210 of FIG. 11 may include the functionality of the compression controller 600 of FIG. 13. This architecture is configurable to perform sums or differences between samples with selectable sample separations and to determine the sample, sample difference/sum or derivative order providing the minimum bits per packet, or best compression. The attenuator 332 may attenuate the integer sample x(n) by an attenuation factor indicated by the compression controller 600 or no attenuation may be indicated. The attenuator 332 may reduce the magnitude of the integer sample by multiplying by an attenuation factor value less than one or by shifting out a number LSBs (dividing by 2) based on an attenuation factor. Applying the attenuator 332 will result in lossy compression.

The attenuation factor may be set to different values to generate levels of compression and distortion in the compressed data. Referring to FIG. 6, the profiler 100 may apply the compressor 2200 to the test data 10 using multiple values of the attenuation factor and measure the resulting distortion levels and compression ratios to provide points 502a-d for the rate-distortion curve 500. The profiler 100 creates a table of the attenuation factor values and the corresponding distortion and compression levels. To select an operating point 508, the profiler 100 may perform a binary search of attenuation factor values to meet the desired distortion level or compression ratio.

For the following description, the variable x(n) represents the integer sample with or without attenuation. The FIFO buffer 344 stores N previous samples x(n−1) to x(n−N), where the delay element 342 provides x(n−1). The selector 346 selects a sample x(n−m) with the desired sample separation from the FIFO buffer 346. The add/subtract element 348 computes the sum or difference between the current integer sample x(n) and the selected sample x(n−m) to form a first result x1(n). If add/subtract element 348 is set to subtract, the result x1(n) represents a first derivative. When the sample spacing index m=1, the result x1(n) is the first derivative of adjacent samples. When the third selector 356 is set to "1", the first result x1(n) is delayed by a second delay element 350 to form x1(n−1) and provided to a second FIFO buffer 352. The second FIFO buffer 352 may store up to M samples of x1 from x1(n−1) to x1(n−M). The second selector 354 selects a sample x1(n−p) from the second FIFO buffer 352 for input to the second adder/subtractor 358. The third selector 356 provides the other input to the adder/subtractor 358. When the third selector 356 is set to "1", the sample x1(n) is input to the second adder/subtractor 358. When the second adder/subtractor 358 is configured to subtract, the result is the second derivative x2(n)=x1(n)−x1(n−p). When the sample spacing indices m=1 and p=1, the resulting x2(n) is the second derivative over adjacent samples. The fourth selector 362 may select the alternative using the fewest bits for the previous packet and provide the respective sample x(n), x1(n) or x2(n) to the block floating point encoder 400. The FIFO buffers 344 and 352 store N and M samples, respectively. The sizes N and M may be set to accommodate compression calculations for a range of data formats.

The block 360 includes logic to determine which of alternatives x(n), x1(n) or x2(n) for the current packet would produce the least number of bits, or most compression, for a compressed packet. A selection parameter corresponding to the alternative with the most compression is provided to the fourth selector 362 and stored in the packet header of the next packet. The selector 362 applies the selection parameter to samples for the next packet. Determining the selection for the next packet based on the current packet data reduces the latency of compression processing. Alternatively, the selection parameter may be based on the current packet data and stored in the current compressed packet, if the latency to determine the minimum bits per packet is tolerable. Alternatively, the selection of x(n), x1(n) or x2(n) may be made during a training period and fixed for subsequent packets. Alternatively, the selector 362 may use a manually-set selection parameter received from the compression controller 600. When the compression processing uses the block floating point encoder 400, the block 360 logic may determine which of the alternatives x(n), $x_1(n)$ and $x_2(n)$ produces the most compression as follows:
 a. For each $i^{th}$ block of N_GROUP samples for a packet, determine the maximum exponent (base 2), or n_exp(i) for each alternative x(n), $x_1(n)$ and $x_2(n)$,
 b. Sum the n_exp(i) for all the blocks for a packet to form a total for each alternative, and
 c. Select the alternative corresponding to the lowest total.

While the above may not explicitly calculate the exact number of bits per compressed packet for each alternative, the alternative producing the best compression is indicated by the lowest total. Alternatively, the maximum magnitude sample, max(i), in each block N_GROUP samples for each alternative can be substituted for n_exp(i).

The adaptive compressor supports compression of multi-dimensional data structures or multiplexed data structures. Certain parameter settings for the components in FIG. 13 are appropriate for compression for two-dimensional (2D) data, such as image samples. For example, let N equal the number of samples representing a row of a 2D data set (or an image) so that a sequence of the integer samples x(n) represents row-ordered samples of two or more rows of the 2D data set, where x(0) to x(N−1) is the first row, x(N) to x(2N−1) is the second row, etc. When the first selector 346 is set to select x(N) and the first adder/subtractor 348 is configured to subtract, the resulting $x_1(n)=x(n)-x(n-N)$ is the difference between corresponding samples in adjacent rows. When the second selector 354 is set to select "1", the third selector 356 is set to select "0", and the second adder/subtractor 358 is configured to subtract, the resulting $x_2(n)=x(n)-x(n-1)$ is the sample difference within the same row. The fourth selector 362 would select the input sample x(n), the row difference sample $x_1(n)$, or the sample difference $x_2(n)$ for block floating point encoding. In the prior discussion with FIG. 9, the DMA descriptor fields H_DIM and V_DIM represented the number of pixels per raster (row) and number of rasters (rows) per frame.

For multiplexed data, a sequence of samples x(n) may represent multiple channels of data, such as data from multiple sensors, multiplexed together to form the sequence. For example, N may represent the number of multiplexed channels, where x(n) to x(n−N+1) represent one sample from each channel at a given time instant and x(n−N) represents two temporally consecutive samples from the same channel. When the first selector 346 is set to select x(n−N) and the first adder/subtractor 348 is configured to subtract, the resulting $x_1(n)=x(n)-x(n-N)$ is the difference between temporally consecutive samples from the same data channel. When the second selector 354 selects samples from a second channel offset from the first channel and the second adder/subtractor 358 is configured to subtract, the difference $x_2(n)=x(n)-x(n-p)$ is the difference between two different channels at a given time instant. The difference between channel data may provide compression when the different channels are correlated. The selector 362 would select the input sample x(n), the intra-channel difference $x_1(n)$, or the inter-channel difference $x_2(n)$ for block floating point encoding.

The adaptive compressor supports compression of data having different center frequencies. As described in the '533 patent, the sample separations and the addition or subtraction operations may be selected to optimally compress the samples based on their center frequency. Techniques for center frequency detection are described in the '533 patent. The center frequency is indicated as a fraction of the sample rate SR. The sample separation parameter may be used by selectors 346 and 354. The selection parameter for the third selector 356 is set to "1" for calculating second order derivatives. The add/subtract configurations apply to both adder/subtractors 348 and 358. The selection of addition or subtraction is related to the positive or negative correlation of the samples separated by the sample separation parameter corresponding to the center frequency.

The fourth selector 360 makes selections of x(n) or $x_1(n)$ to initialize the data for the compressed packet. For initialization, the fourth selector 360 may select the sample x(n) for absolute encoding as the initial sample of the compressed packet. Thus, when the first derivatives or differences $x_1(n)$ are to be encoded for a particular compressed packet, at least the initial sample for the packet will be the absolutely encoded x(n). When the second derivatives $x_2(n)$ are to be encoded for a particular compressed packet, the fourth selector 360 may select the sample x(n) for the initial sample and the first derivative $x_1(n)$ for the second sample of the compressed packet. This initialization may be performed at least once per compressed packet.

The compression controller 600 may provide the parameters for the components of the adaptive compressor architecture, including an attenuation factor for the attenuator 332, the sample separation parameter for the selectors 346 and 354, add/subtract selection parameter for the adder/subtractors 348 and 358 and selection parameter for the third selector 356. The compression controller may store configuration parameters corresponding to multiple data structures in memory. When a particular data structure is to be compressed, the compression controller 600 may retrieve the appropriate parameters and provide them to the corresponding components of the adaptive compressor. Data structure information may include, for example, on multidimensional data parameters, multiplexed data parameters or image data parameters. The compression controller may receive information on center frequency, for example, from a center frequency detector of the data characterization block 104 and select the corresponding parameters for the components of the adaptive compressor, as described in the '533 patent.

Referring to FIGS. 9 and 13, the control parameter STRIDE1 refers to the sample separation used by the selector 346 to select the sample x(n−m) from the FIFO buffer 346. The control parameter STRIDE2 refers to the sample separation used by the second selector 354 to selects a sample $x_1(n-p)$ from the second FIFO buffer 352. The control parameter ADD_SUB indicates the operation performed by the adder/subtractor elements 348 and 358. The control parameter DERIV indicates the selection of x(n), x1(n) or x2(n) by the selector 362. The controller 2210 may provide these control parameters to the redundancy remover 2214 and the header generator 2212. The DERIV parameter may be set by the user or determined during compression processing.

Figure 14:
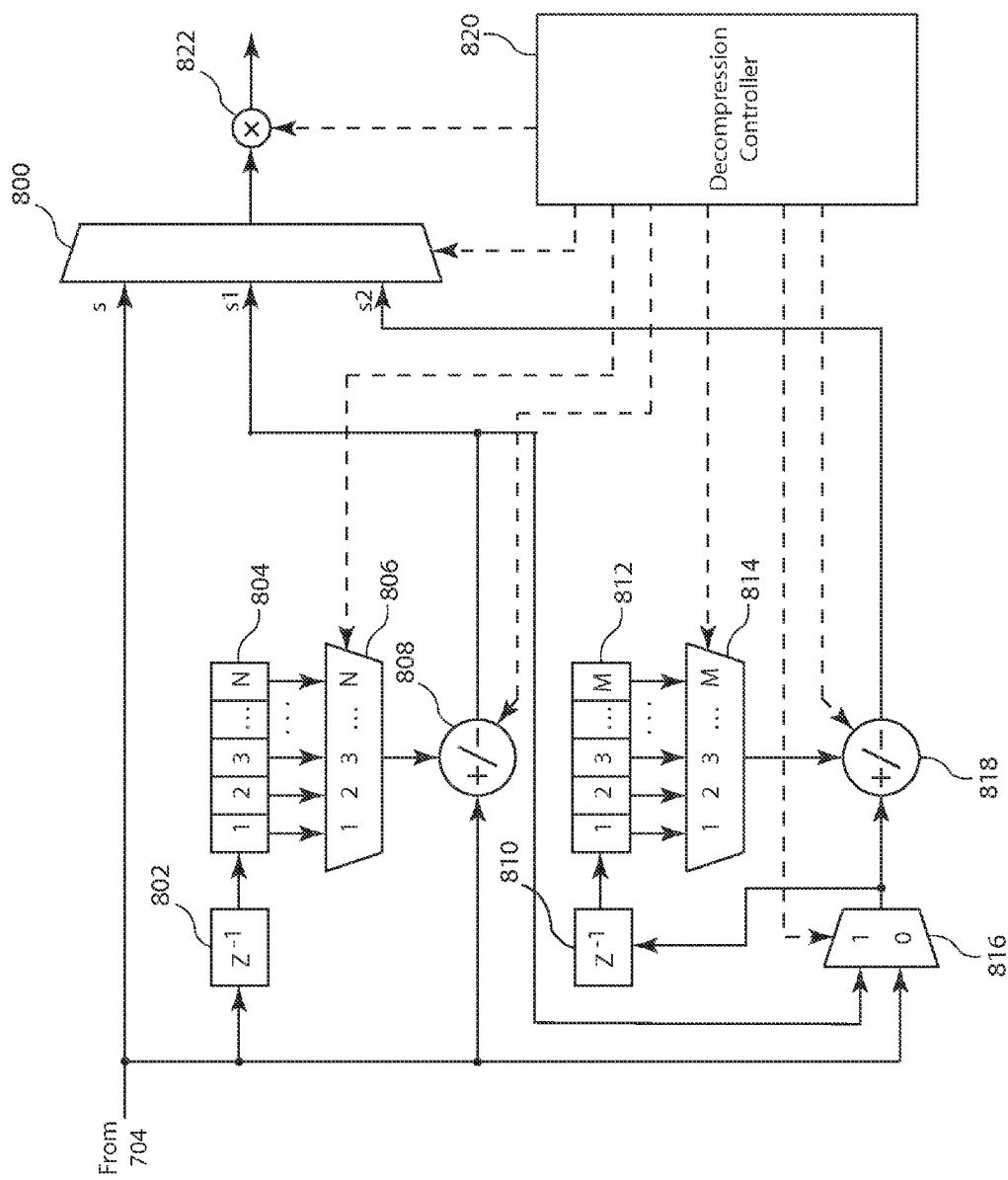
FIG. 14 illustrates an adaptive decompressor architecture for the signal regenerator of FIG. 12, as used in one example system for integer decompression.

Components of the decompressor 2200 are described in the following. FIG. 14 illustrates an adaptive decompressor architecture for the signal regenerator 1810 of FIG. 12, as used in one example system for integer decompression. The decompression controller 1804 of FIG. 12 may include the functionality of the decompression controller 820 of FIG. 14. The bit unpacker 1808 applies block floating point (BFP) decoding to provide decoded samples to the adaptive decompressor. The adaptive decompressor performs sums or differences between decoded samples separated by selectable sample spacings to invert the compression operations performed by the adaptive compressor of FIG. 13. For the following description, the variable s(n) represents a decoded sample output from the BFP decoder of the bit unpacker 1808. The FIFO buffer 804 stores N previous samples s(n−1) to s(n−N), where the delay element 802 provides s(n−1). The selector 806 selects a sample s(n−m) with the desired sample separation from the FIFO buffer 804. The add/subtract element 808 computes the sum or difference between the current decoded sample s(n) and the selected sample s(n−m) to form a first result $s_1(n)$. If add/subtract element 808 is configured to add, the result $s_1(n)$ represents a first integral $s_1(n)=s(n)+s(n−m)$. When the sample spacing index m=1, the result $s_1(n)$ is the first integral of adjacent decoded samples. When the third selector 816 is set to "1", the first result $s_1(n)$ is delayed by a second delay element 810 to form $s_1(n−1)$ and provided to a second FIFO buffer 812. The second FIFO buffer 812 may store up to M samples of $s_1$ from $s_1(n−1)$ to $s_1(n−M)$. The second selector 814 selects a sample $s_1(n−p)$ from the second FIFO buffer 812 for input to the second adder/subtractor 818. The third selector 816 provides the other input to the adder/subtractor 818. When the third selector 816 is set to "1", the sample $s_1(n)$ is input to the second adder/subtractor 818. When the second adder/subtractor 818 is configured to add, the result is the second integral $s_2(n)=s_1(n)+s_1(n−p)$. When the sample spacing indices m=1 and p=1, the resulting $s_2(n)$ is the second integral over adjacent decoded samples. The fourth selector 800 selects the sample s(n), $s_1(n)$ or $s_2(n)$ indicated by the corresponding decompression parameter and provides the selected sample to the multiplier 822. The multiplier 822 multiplies the selected sample by a gain factor to invert the attenuation factor applied by attenuator 332. Since applying the attenuator 332 produced lossy compression, multiplication by the gain factor will produce an approximation of original sample value. If attenuation was not applied during compression, the gain factor for multiplier 822 is set to "1" or the multiplier is bypassed. The decompression controller 820 may determine the gain factor based on attenuation information (ATTEN) extracted from the compressed packet header or provided by the profiler 100. The FIFO buffers 804 and 812 store N and M samples, respectively, to accommodate different data structures.

The adaptive decompressor architecture supports decompression of multidimensional data structures or multiplexed data structures using parameter settings described with respect to the adaptive compressor architecture of FIG. 13. For the 2D data set example, where N equals the number of samples representing a row of a 2D data set (or an image), the first selector 806 is set to select s(N) and the first adder/subtractor 808 is configured to add, the resulting $s_1(n)=s(n)+s(n−N)$ sums the decoded samples to reverse the difference operation of adjacent rows performed for compression. When the second selector 814 is set to select "1", the third selector 816 is set to select "0", and the second adder/subtractor 818 is configured to add, the resulting $s_2(n)=s(n)+s(n−1)$ sums decoded samples to reverse the difference operation of samples within the same row performed for compression. For the multiplexed data example described above, N represents the number of multiplexed channels. When the first selector 806 is set to select s(n−N) and the first adder/subtractor 808 is configured to add, the resulting $s_1(n)=s(n)+s(n−N)$ reverses the difference between temporally consecutive samples from the same data channel performed for compression. When the second selector 814 selects samples from the second channel offset from the first channel and the second adder/subtractor 818 is configured to add, the difference $s_2(n)=s(n)+s(n−p)$ reverses the difference between two different channels performed for compression. The fourth selector 800 selects from s(n), $s_1(n)$ or $s_2(n)$ based on the compression parameter from the compressed packet header or provided by the profiler 100.

The adaptive decompressor architecture supports decompression of data having different center frequencies. The selectors 806 and 814 select sample spacing and the addition or subtraction operations to reverse the operations performed by the adaptive compressor the samples based on their center frequency. The selection parameter for the third selector 816 is set to "1" for calculating second order integrals. The configurations of the adder/subtractors 808 and 818 reverse the operations of the adder/subtractors 348 and 358.

The fourth selector 800 makes selections of s(n) or $s_1(n)$ corresponding to the initialized data of the compressed packet. When the first derivatives or differences $x_1(n)$ were encoded for a particular compressed packet, at least the initial sample for the packet will be absolutely encoded. For the initial decoded sample from the compressed packet, the fourth selector 800 may select s(n) as the initial sample. The fourth selector 800 would select the first integral $s_1(n)$ for the remaining decoded samples from the compressed packet. When the second derivatives $x_2(n)$ were encoded for a particular compressed packet, the fourth selector 800 may select the sample s(n) for the initial sample and the first integral $s_1(n)$ for the second sample, and the second integral $s_2(n)$ for the remaining decoded samples from the compressed packet. This initialization may be performed at least once for decoded samples from a compressed packet, depending on the initialization performed during compression.

The decompression controller 820 may provide the decompression parameters for the components of the adaptive decompressor, including the gain factor for the multiplier 822, the sample separation parameters for the selectors 806 and 814, add/subtract configuration parameters for the adder/subtractors 808 and 818 and selection parameters for the selectors 816 and 800. The decompression controller 820 may determine the decompression parameters based on the compression parameters extracted from the compressed packet header or provided by the profiler 100. For example, the gain factor may be generated using a lookup table based on the control parameter ATTEN retrieved from the compressed packet header or provided by the profiler 100. The samples separation parameters STRIDE1 and STRIDE2 apply to the selectors 806 and 814, respectively. The ADD_SUB parameter configures the adder/subtractor elements 808 and 818. The DERIV parameter determines the selection of s(n), s1(n) or s2(n) by the selector 800.

Referring to FIG. 12, the floating point post-processor 1814 may apply integer to float format conversion to the decompressed integer samples output from the signal regenerator 1810 to the reconstruct the floating-point data.

Some of the control parameters for the compression modes described above are encoded in the compression DMA descriptor (FIG. 9). For the compression DMA descriptor, the parameters are related as follows:

N_FIFO: corresponds to N in FIGS. 13 and 14.

RR_STRIDE2: corresponds to the sample separation parameter for the selector 354 (FIG. 13) and the selector 814 (FIG. 14).

RR_MANUAL_STRIDE1: corresponds to a manual setting for the sample separation parameter for the selector 346 (FIG. 13) and the selector 806 (FIG. 14).

RR_MANUAL_ADD_SUB: corresponds to manual settings for the add/subtract elements 348 and 358 (FIG. 13) and the add/subtract elements 808 and 818 (FIG. 14).

RR_MANUAL_DERIV: corresponds to a manual setting of the selection parameter for the selector 362 (FIG. 13) and selector 800 (FIG. 14).

RR_AUTO_MANUAL: corresponds to providing automatic or manual settings for three parameters: sample separation parameter STRIDE1 for the selector 346 (FIG. 13) and the selector 806 (FIG. 14), ADD_SUB settings for the add/subtract elements 348 and 358 (FIG. 13) and the add/subtract elements 808 and 818 (FIG. 14), and DERIV selection parameter for the selector 362 (FIG. 13) and selector 800 (FIG. 14).

ATTEN: corresponds to the attenuation factor for the attenuator 332 in FIG. 13.

The profiler 100 may recommend an initial recommended operating point using test data 10 (which is representative of production data 16) and apply parameters of the operating point to the entire set of production data 16. Alternatively, the profiler 100 may be configured to generate intermittent updates to the recommended operating point 508, referred to as dynamic profiling. In the dynamic profiling mode, the recommended operating point 508 (recommended distortion level 504 or recommended compression ratio 506) can change over time. For instance, some data sets may contain periodic dynamic range or spectral fluctuations that would not be tracked if a single operating point were to be used for all instances of production data 16. In such instances, it may be preferable to apply the profiler 100 to the production data 16 periodically or intermittently.

In the dynamic profiling mode, the rate at which the profiler 100 provides updates may be periodic (i.e. profiler 100 provides updates every P samples or at given time intervals). Alternatively, the profiler 100 may provide updates based on external changes to the system (i.e. changing the operating mode of a process) or changes to the production data 16 itself (i.e. the signal peak, noise floor, or other signal statistics have changed). For each update, the profiler 100 may process another subset of the production data to generate a new profiler output 112. The dynamic profiling mode may include a function that determines when (and whether) lossless or lossy compression should be applied to production data 16, based on user preferences.

Figure 15A:
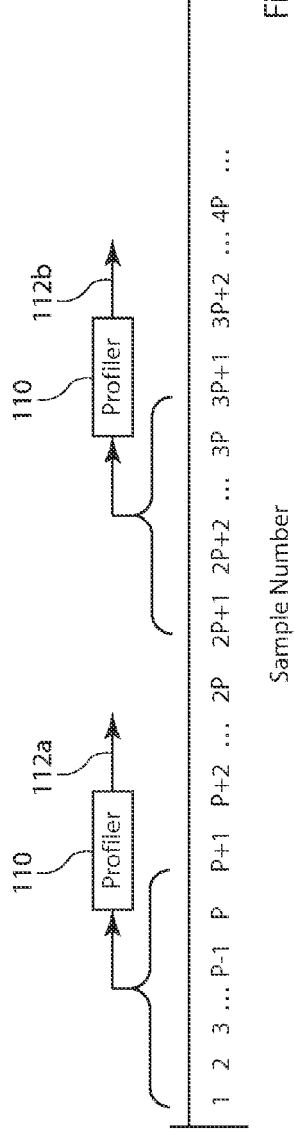
FIGS. 15a-c give examples of the dynamic profiling mode for updating profiler outputs.
Figure 15B:
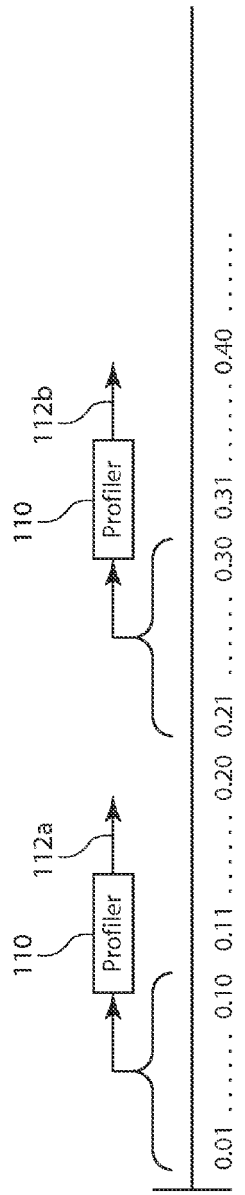
Figure 15C:
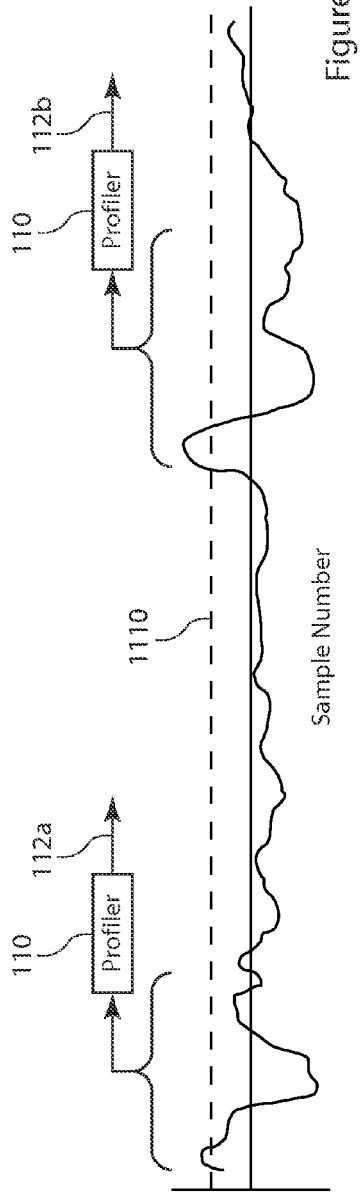

FIGS. 15a-c give examples of the dynamic profiling mode for updating profiler outputs. FIG. 15a illustrates an example of dynamic profiling performed every 2P samples, generating profiler output 112a at or after sample P and profiler output 112b at or after sample 3P. FIG. 15b illustrates an example of dynamic profiling performed every 0.2 microseconds (usec), generating profiler output 112a at or after time 0.1 usec, and generating profiler output 112b at or after time 0.3 usec. FIG. 15c illustrates an example of dynamic profiling performed when production data 16's maximum value exceeds threshold 1100.

While preferred embodiments of the compressors 18 and 118 have been described, the profiler 100 may be used to determine parameters specific to other compression algorithms. The relationship between the compression algorithm's parameters and the distortion levels (and/or compression ratios) can be determined, for example, by Monte Carlo simulations using test data sets or simulated data. Once the relationship has been determined, a table of parameters versus distortion levels (and/or compression ratios) can be stored in memory for use by the compression parameter generation block 110.

A preferred platform for implementation of the profiler 100 is a computer system, such as described with respect to FIG. 10, where the data processor 714 executes a program with functions that implement operations of the profiler 100, as described with respect to FIG. 2. The profiler program may be stored in the computer readable medium 740. The profiler output 112 parameters may be stored to the RAM 730, the file storage subsystem 728 or a computer readable medium 742. Display 120 of the profiler output may be provided to the user interface output devices 720. User inputs 101 may be provided via the user interface input devices 722. The test data set 10 and/or the production data 16 may be provided via the communication interface 716. The compressed data output from the compressor 18 may be stored in the storage subsystem 724 or computer readable medium 740 or the compressed data may be output via the communication interface 716. The data processor 714 may execute the operations of the compressors 18 and 118. Alternatively, the data processor 714 may include specialized logic for the operations of the compressor 18 and compressor/decompressor 118. Alternatively, the data processor 714 may execute the operations of the compressor/decompressor 18 and the compressor 18 may be implemented in other specialized logic in the computer system. Alternatively, the compressor 18 may be implemented in a different computer system from the profiler or in external compression logic. For example, the profiler 100 as executed by the data processor 714 may store the parameters profiler output 112 to the computer readable medium 740 for later processing of the production data 16 by a different computer system or by external compression logic.

Specialized logic for compression and/or decompression operations can be implemented in hardware, software or a combination of both, and incorporated in computing systems. The hardware implementations include ASIC, FPGA or an intellectual property (IP) block. The compression and decompression operations can be implemented in software or firmware on a programmable processor, such as a digital signal processor (DSP), microprocessor, microcontroller, multi-core CPU, or GPU, as further described in the '061 application.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

What is claimed is:

1. A method for data compression, comprising:
applying a compression algorithm by a data processor to a test data set to generate a plurality of compressed test data sets using varying of compression parameters, wherein the test data set is representative of a data set to be compressed using the compression algorithm;
generating a computer implemented model for the compression algorithm using the test data set and the plurality of compressed data sets, the model characterizing correlation between or among the compression parameters and distortion levels;
determining a characteristic of the test data set, wherein the characteristic comprises a noise floor of the test data set; and
receiving data that selects an operating point for use to configure the compression algorithm to be applied to the data set, wherein operating points are associated with one or more of the compression parameters and distortion levels according to the model, and wherein a distortion level for the operating point is set to a value below the noise floor.

2. The method of claim 1, wherein the distortion level is set to the value of at least 6 decibels (dB) below the noise floor.

3. The method of claim 1, where the model comprises a rate-distortion curve.

4. The method of claim 1, wherein said applying a compression algorithm includes applying a plurality of compression algorithms to the test data set, wherein said generating the computer implemented model includes generating a plurality of computer implemented models, each associated with one of the compression algorithms, the method further comprising selecting one compression algorithm from the plurality of compression algorithms based on the computer implemented models.

5. The method of claim 1, further comprising:
   providing a plurality of performance parameters associated with a plurality of compression algorithms; and
   selecting one of the compression algorithms based on the performance parameters.

6. The method of claim 1, wherein the characteristic includes a spectrum of the test data set.

7. The method of claim 1, wherein said generating the computer implemented model further includes determining the distortion level of the compressed test data set, comprising:
   decompressing samples of the compressed test data;
   subtracting decompressed samples from corresponding samples of the test data to produce error samples; and
   calculating a spectrum of the error samples, wherein a magnitude of the spectrum represents the distortion level.

8. The method of claim 1, wherein said receiving data that selects an operating point further includes:
   receiving an input distortion level from a user interface; and
   determining the operating point corresponding to the input distortion level.

9. The method of claim 1, further includes storing the one or more compression parameters associated with the operating point in a direct memory access (DMA) descriptor associated with the data set.

10. The method of claim 1, further comprising providing the one or more compression parameters associated with the operating point to an application programming interface (API) to apply the compression algorithm to the data set according to the compression parameters.

11. The method of claim 1, wherein the test data set is a subset of the data set to be compressed.

12. The method of claim 1, further comprising:
    determining a characteristic of a subset of the data set to be compressed; and
    selecting an updated operating point based on the characteristic using the computer implemented model, wherein the updated operating point is associated with one or more updated compression parameters and an updated distortion level.

13. The method of claim 12, further comprising generating an updated computer implemented model based on the subset of the data set.

14. The method of claim 1, wherein the compression parameters include a compression ratio.

15. The method of claim 14, wherein the compression ratio is represented by one or more of the following:
    a number of bits per sample,
    a percentage size reduction of the compressed test data set compared to the test data set, and
    a percentage of an original size of the test data set.

16. The method of claim 1, wherein the distortion level is represented by one or more of:
    a percent uncertainty,
    an effective number of bits, and
    a number of significant digits.

17. A computer system, comprising:
    a data processor and memory accessible by the data processor, the memory storing computer programs executable by the data processor, including at least one program having a set of functions that implement operations of a profiler to:
    determine one or more compression parameters for a compression algorithm to be applied to a data set;
    apply the compression algorithm to a test data set using varying of compression parameters to generate a plurality of compressed test data sets, wherein the test data set is representative of a data set to be compressed;
    generate a computer implemented model for the compression algorithm using the test data set and the plurality of compressed test data sets, the model characterizing correlation between or among the compression parameters and distortion levels;
    determine a characteristic of the test data set, wherein the characteristic comprises a noise floor of the test data set; and
    select an operating point using the computer implemented model for use to configure the compression algorithm to be applied to the data set, wherein operating points are associated with one or more of the compression parameters and distortion levels according to the model, and wherein a distortion level for the operating point is set to a value below the noise floor.

18. The computer system of claim 17, wherein the distortion level is set to the value of at least 6 decibels (dB) below the noise floor.

19. The computer system of claim 17, where the model comprises a rate-distortion curve.

20. The computer system of claim 17, wherein the profiler operations apply a plurality of compression algorithms to the test data set to generate a plurality of computer implemented models, each associated with one of the compression algorithms, and to select one compression algorithm from the plurality of compression algorithms based on the computer implemented models.

21. The computer system of claim 17, wherein a plurality of performance parameters associated with a plurality of compression algorithms are stored in the memory, the profiler operations to select one of the compression algorithms based on the performance parameters.

22. The computer system of claim 17, wherein the characteristic includes a spectrum of the data set.

23. The computer system of claim 17, wherein the profiler operations further include logic to determine the distortion level, comprising:
    logic to decompress samples of the compressed test data;
    logic to subtract the decompressed samples from corresponding samples of the test data to produce error samples; and
    logic to calculate a spectrum of the error samples, wherein a magnitude of the spectrum represents the distortion level.

24. The computer system of claim 17, further comprising a user interface to provide an input distortion level to the processor, wherein the profiler operations determine the operating point and the compression ratio corresponding to the input distortion level.

25. The computer system of claim 17, wherein the data processor provides the one or more compression parameters associated with the operating point to a direct memory access (DMA) descriptor associated with the data set.

26. The computer system of claim 17, wherein the data processor provides the one or more compression parameters associated with the operating point to an application programming interface (API) to apply the compression algorithm to the data set in accordance with the compression parameters.

27. The computer system of claim 17, wherein the test data set is a subset of the data set to be compressed.

28. The computer system of claim 17, wherein the profiler operations further include:
  logic to determine a characteristic of a subset of the data set to be compressed; and
  logic to select an updated operating point based on the characteristic using the computer implemented model, wherein the updated operating point is associated with one or more updated compression parameters and an updated distortion level.

29. The computer system of claim 28, further comprising logic to generate an updated computer implemented model based on the subset of the data set.

30. The computer system of claim 17, wherein the compression parameters include a compression ratio.

31. The computer system of claim 30, wherein the compression ratio is represented by one or more of the following:
  a number of bits per sample,
  a percentage size reduction of the compressed test data set compared to the test data set, and
  a percentage of an original size of the test data set.

32. The computer system of claim 17, wherein the distortion level is represented by one or more of the following:
  a percent uncertainty,
  an effective number of bits, and
  a number of significant digits.

33. An article of manufacture, comprising:
  a memory readable by a data processor, the memory storing instructions executable by the data processor, including instructions for operations of a profiler for processes that:
  determine one or more compression parameters for a compression algorithm to be applied to a data set;
  apply the compression algorithm to a test data set using varying of compression parameters to generate a plurality of compressed test data sets, wherein the test data set is representative of a data set to be compressed;
  generate a computer implemented model for the data set and the compression algorithm using the test data set and the plurality of compressed data sets, the model characterizing correlation between or among the compression parameters and distortion levels;
  determine a characteristic of the test data set, wherein the characteristic comprises a noise floor of the test data set; and
  select an operating point using the computer implemented model for use to configure the compression algorithm to be applied to the data set, wherein operating points are associated with one or more of the compression parameters and distortion levels according to the model, and wherein a distortion level for the operating point is set to a value below the noise floor.

34. The article of manufacture of claim 33, wherein the value is at least 6 decibels (dB) below the noise floor.

35. The article of manufacture of claim 33, where the model comprises a rate-distortion curve.

36. The article of manufacture of claim 33, wherein the profiler operations further include operations to apply a plurality of compression algorithms to the test data set to generate a plurality of computer implemented models, each associated with one of the compression algorithms and to select one compression algorithm from the plurality of compression algorithms based on the computer implemented models.

37. The article of manufacture of claim 33, wherein the instructions indicate a plurality of performance parameters associated with a plurality of compression algorithms, wherein the profiler operations further include an operation to select one of the compression algorithms based on the performance parameters.

38. The article of manufacture of claim 33, wherein the characteristic includes a spectrum of the data set.

39. The article of manufacture of claim 33, wherein the profiler operations further include operations to decompress samples of the compressed test data, to subtract the decompressed samples from corresponding samples of the test data to produce error samples, and to calculate a spectrum of the error samples, wherein a magnitude of the spectrum represents the distortion level.

40. The article of manufacture of claim 33, wherein the profiler operations further include operations to determine the operating point and the compression ratio corresponding to an input distortion level to be provided via a user interface.

41. The article of manufacture of claim 33, wherein the profiler operations further include an operation to store the one or more compression parameters associated with the operating point in a direct memory access (DMA) descriptor associated with the data set.

42. The article of manufacture of claim 33, wherein the profiler operations further include an operation to provide the one or more compression parameters associated with the operating point to an application programming interface (API) to apply the compression algorithm to the data set in accordance with the compression parameters.

43. The article of manufacture of claim 33, wherein the profiler operations further include operations to provide a subset of the data set as the test data set.

44. The article of manufacture of claim 33, wherein the profiler operations further include:
  logic to determine a characteristic of a subset of the data set to be compressed;
  logic to select an updated operating point based on the characteristic using the computer implemented model, wherein the updated operating point is associated with one or more updated compression parameters and an updated distortion level; and
  logic to determine one or more updated parameters for the compression algorithm, based on the updated operating point.

45. The article of manufacture of claim 44, wherein the profiler operations further include operations to generate an updated computer implemented model based on the subset of the data set.

46. The article of manufacture of claim 33, wherein the compression parameters include a compression ratio.

47. The article of manufacture of claim 46, wherein the compression ratio is represented by one or more of the following:
  a number of bits per sample,
  a percentage size reduction of the compressed test data set compared to the test data set, and
  a percentage of an original size of the test data set.

48. The article of manufacture of claim 33, wherein the distortion level is represented by one or more of the following:
  a percent uncertainty,
  an effective number of bits, and
  a number of significant digits.

49. A method for data compression, comprising:
  calculating a noise floor of a test data set by a data processor, wherein the test data set is representative of a data set to be compressed by a compression algorithm;
  setting a distortion level for the compression algorithm to a value lower than the noise floor; and determining one or more compression parameters based on the distortion level for use to configure the compression algorithm to be applied to the data set.

50. The method of claim 49, wherein the noise floor and the distortion level have units of decibels (dB), wherein said setting a distortion level sets the value to at least 6 dB below the noise floor.

51. The method of claim 49, wherein further comprising: calculating a first effective number of bits (ENOB) for samples in the test data set based on the noise floor, wherein said setting a distortion level sets a second ENOB for decompressed samples corresponding to the test data set to a value greater than the first ENOB.

52. The method of claim 49, further including storing the one or more compression parameters in a direct memory access (DMA) descriptor associated with the data set.

53. The method of claim 49, further comprising providing the one or more compression parameters to an application programming interface (API) to apply the compression algorithm to the data set according to the compression parameters.

54. The method of claim 49, wherein the test data set is a subset of the data set to be compressed.

55. The method of claim 49, further comprising:
calculating an updated noise floor of a subset of the data set to be compressed;
setting an updated distortion level based on the updated noise floor; and
determining one or more updated compression parameters for the compression algorithm, based on the updated distortion level.

56. A computer system, comprising:
a data processor and memory accessible by the data processor, the memory storing computer programs executable by the data processor, including at least one program having a set of functions that implement operations to determine one or more compression parameters for a compression algorithm to be applied to a data set, the operations to calculate a noise floor of a test data set, wherein the test data set is representative of the data set, to set a distortion level to a value lower than the noise floor, to determine the one or more compression parameters based on the distortion level for use to configure the compression algorithm to be applied to the data set.

57. The computer system of claim 56, wherein the noise floor and the distortion level have units of decibels (dB), the operations including an operation to set the distortion level to the value of at least 6 dB below the noise floor.

58. The computer system of claim 56, the operations further including operations to calculate a first effective number of bits (ENOB) for samples in the test data set based on the noise floor and to set a second ENOB for decompressed samples corresponding to the test data set to a value greater than the first ENOB.

59. The computer system of claim 56, wherein the data processor provides the one or more compression parameters to a direct memory access (DMA) descriptor associated with the data set.

60. The computer system of claim 56, wherein the data processor provides the one or more compression parameters to an application programming interface (API) to apply the compression algorithm to the data set in accordance with the compression parameters.

61. The computer system of claim 56, wherein the test data set is a subset of the data set to be compressed.

62. The computer system of claim 56, wherein the operations further include:
logic to calculate an updated noise floor of a subset of the data set to be compressed;
logic to set an updated distortion level based on the updated noise floor; and
logic to determine one or more updated compression parameters for the compression algorithm, based on the updated distortion level.

63. An article of manufacture, comprising:
memory readable by a data processor, the memory storing instructions executable by the data processor, including instructions for operations to determine one or more compression parameters for a compression algorithm to be applied to a data set, including operations to calculate a noise floor of a test data set, wherein the test data set is representative of the data set, to set a distortion level to a value lower than the noise floor, to determine the one or more compression parameters based on the distortion level for use to configure the compression algorithm to be applied to the data set.

64. The article of manufacture of claim 63, wherein the noise floor and the distortion level have units of decibels (dB), the operations including an operation to set the distortion level to the value of at least 6 dB below the noise floor.

65. The article of manufacture of claim 63, the operations further including operations to calculate a first effective number of bits (ENOB) for samples in the test data set based on the noise floor and to set a second ENOB for decompressed samples corresponding to the test data set to a value greater than the first ENOB.

66. The article of manufacture of claim 63, wherein the operations include an operation to store the one or more compression parameters in a direct memory access (DMA) descriptor associated with the data set.

67. The article of manufacture of claim 63, wherein the operations include an operation to provide the one or more compression parameters to an application programming interface (API) to apply the compression algorithm to the data set in accordance with the compression parameters.

68. The article of manufacture of claim 63, wherein the operations further include operations to provide a subset of the data set as the test data set.

69. The article of manufacture of claim 63, wherein the operations further include:
logic to calculate an updated noise floor of a subset of the data set to be compressed;
logic to set an updated distortion level based on the updated noise floor; and
logic to determine one or more updated compression parameters for the compression algorithm, based on the updated distortion level.

* * * * *